United States Patent [19]
Takai

[11] Patent Number: 5,906,158
[45] Date of Patent: May 25, 1999

[54] SCREEN PRINTING APPARATUS AND METHOD

[75] Inventor: Mitsuji Takai, Seki, Japan

[73] Assignee: Sakurai Graphic Systems Corporation, Tokyo, Japan

[21] Appl. No.: 08/942,847

[22] Filed: Oct. 2, 1997

[30] Foreign Application Priority Data

Oct. 31, 1996 [JP] Japan .................................. 8-289850

[51] Int. Cl.⁶ .................................................. B41F 15/14
[52] U.S. Cl. .......................... 101/123; 101/126; 101/129; 101/484
[58] Field of Search ........................... 101/DIG. 36, 484, 101/485, 486, 126, 129, 123; 33/614, 615, 616, 617, 619, 620, 621

[56] References Cited

U.S. PATENT DOCUMENTS

| | | | |
|---|---|---|---|
| 4,193,344 | 3/1980 | Ericsson | 101/126 |
| 4,254,707 | 3/1981 | Lambert et al. | 101/123 |
| 4,267,773 | 5/1981 | Scherp et al. | 101/123 |
| 4,413,559 | 11/1983 | Bubley | 101/123 |
| 4,474,109 | 10/1984 | Yara | 101/115 |
| 4,537,126 | 8/1985 | Bubley | 101/123 |
| 4,905,592 | 3/1990 | Sorel | 101/123 |
| 4,924,304 | 5/1990 | Freeman | 358/101 |
| 5,060,063 | 10/1991 | Freeman | 358/101 |
| 5,136,938 | 8/1992 | Pellegrina | 101/115 |
| 5,176,076 | 1/1993 | Azuma et al. | 101/123 |
| 5,239,613 | 8/1993 | Motev et al. | 392/412 |
| 5,459,941 | 10/1995 | Lowe | 33/620 |
| 5,471,924 | 12/1995 | Helling | 101/38.1 |
| 5,479,854 | 1/1996 | Chikahisa et al. | 101/123 |
| 5,483,884 | 1/1996 | Vellanki | 101/126 |
| 5,592,877 | 1/1997 | Szyszko et al. | 101/129 |
| 5,651,309 | 7/1997 | Motev | 101/123 |
| 5,735,203 | 4/1998 | Taniguchi et al. | 101/126 |
| 5,740,729 | 4/1998 | Hikita et al. | 101/126 |

FOREIGN PATENT DOCUMENTS

| | | | |
|---|---|---|---|
| 61-14956 | 1/1986 | Japan . | |
| 1-099286 | 4/1989 | Japan | 101/123 |

*Primary Examiner*—Ren Yan
*Attorney, Agent, or Firm*—Crompton, Seager & Tufte LLC.

[57] ABSTRACT

A screen printing apparatus in which alignment marks are provided on the screen and the printing material. The marks are detected accurately and clearly by an alignment mark detector located between the printing material and the screen.

14 Claims, 26 Drawing Sheets

Fig.18
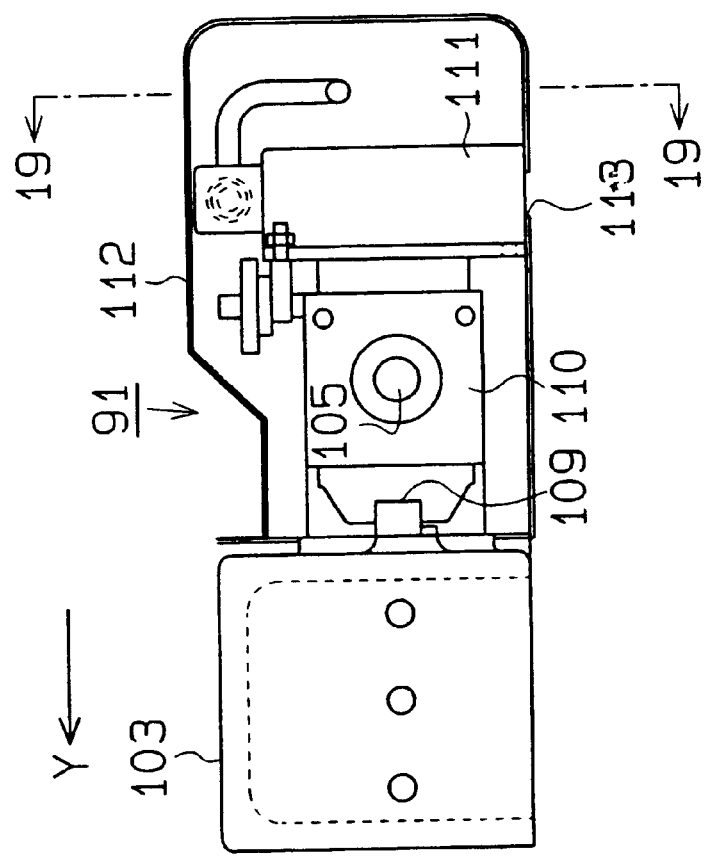
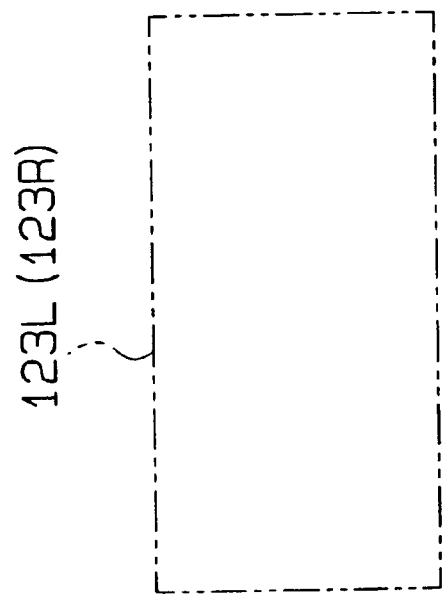

SCREEN PRINTING APPARATUS AND METHOD

CROSS-REFERENCE TO CO-PENDING APPLICATIONS

This application is related to U.S. patent application Ser. No. 08/943,083, filed Oct. 2, 1997, entitled SCREEN PRINTING APPARATUS, U.S. patent application Ser. No. 08/942,650, filed Oct. 2, 1997, entitled SCREEN PRINTING MACHINE, U.S. patent application Ser. No. 08/942,502, filed Oct. 2, 1997, entitled SCREEN PRINTING APPARATUS AND METHOD OF DRYING COATING FILMS, all of which are assigned to the assignee of the present invention, and all of which are incorporated herein by reference.

BACKGROUND OF THE INVENTION

1. Field of the Invention

The present invention relates to a screen printing apparatus that can adjust the position of a material to be printed on mounted on a table and that of a screen relative to each other to achieve proper alignment and to a method of adjusting the printing position.

2. Description of the Related Art

Screen printing apparatuses are known for applying an ink (or a printing paste) on a material (hereinafter referred to as printing material) such as paper and substrates. In such a printing apparatus, a squeegee is slid from a printing start side toward a printing end side on a screen on which an ink is loaded to apply the ink onto the printing material mounted on a printing table. After completion of printing, a scraper is slid from the printing end side toward the printing start side to scrape the residual ink on the screen back to the printing start side. By repeating the procedures described above, a plurality of printing materials are designed to be printed successively.

However, when a printing material mounted on the printing table is printed as described above, it is necessary to carry out accurate alignment between the screen and the printing material. For such purpose, the screen and the printing material are generally provided with alignment marks for bringing them in proper printing positions.

In a double-table type screen printing apparatus, alignment of the screen and the printing material with each other using the alignment marks provided on both of them and actual printing are often carried out at different places. In such case, the screen and the printing material get out of position relative to each other when they are transferred from the aligning place to the printing place, leading to poor printing accuracy.

There is another method, in which the alignment marks provided on the screen are detected by alignment mark detectors located above the screen, and the alignment marks provided on the printing material are detected through the screen by the alignment mark detectors located above the screen to adjust the position of a table unit based on these detection results in the X, Y and theta (θ) directions.

However, in this case, due to the structure of the screen printing apparatus where the screen is arranged above the printing material mounted on the table, the alignment mark detectors are spaced away from the screen so as to detect the alignment marks provided on the printing material through the screen.

Accordingly, the screen hinders accurate detection of the marks, particularly the pattern of the alignment marks provided on the printing material. Therefore, in order to accurately detect the pattern of the alignment marks on the printing material, it is necessary, for example, to increase the detection sensitivity of the alignment mark detectors or to apply a filtering treatment through an electric circuit so as to remove the screen from the image detected.

SUMMARY OF THE INVENTION

The present invention has been accomplished in order to solve the problems described above, and it is an objective of the present invention to provide a screen printing apparatus that accurately and clearly detects the alignment mark provided on the screen and the alignment mark provided on the printing material and also to provide a printing position adjusting method.

One aspect of the present invention relates to a screen printing apparatus for printing on material mounted on a table with a printing paste employing a screen and a squeegee, the apparatus including a device for supporting the screen for reciprocation between a vicinal position, where the screen is close to the printing material mounted on the table, and a distant position, where the screen is spaced upward from the printing material; a device for detecting alignment marks provided on the printing material mounted on the table and for detecting alignment marks provided on the screen; a device for carrying the alignment mark detector into the space between the screen and the printing material when the screen is located at the distant position; a device for adjusting the position of the table and that of the screen relative to each other; and a device for controlling the adjusting device based on detection results of the alignment marks of the printing material and those of the alignment marks of the screen obtained by the alignment mark detecting device.

The detecting device may include a first detecting device and a second detecting device. The first detecting device detects alignment marks provided on the printing material mounted on the table. The second detecting device detects alignment marks provided on the screen. The adjusting means may be designed to adjust of both the position of the table and that of the screen or the position of only one of them while the position of the other is fixed.

Meanwhile, another aspect of the present invention relates to a method of relatively adjusting printing position between a material and a screen. Alignment marks are provided on the material and the screen. The method includes the steps of: (a) locating the material on a table; (b) providing the screen over the material; (c) detecting alignment marks provided on the material in the space between the screen and the material to be printed on; (d) detecting the alignment marks provided on the screen in the space between the screen and the material to be printed on; and (e) adjusting the position of the table or the screen based on the detection results to align the material and the screen.

Other aspects and advantages of the invention will become apparent from the following description, taken in conjunction with the accompanying drawings, illustrating by way of example the principles of the invention.

BRIEF DESCRIPTION OF THE DRAWINGS

The features of the present invention that are believed to be novel are set forth with particularity in the appended claims. The invention, together with the objects and advantages thereof, may best be understood by reference to the following description of the presently preferred embodiments together with the accompanying drawings in which:

FIG. 18 is a cross-sectional view, taken along the line 18—18 in FIG. 17;

DESCRIPTION OF THE PREFERRED EMBODIMENTS

The screen printing apparatus according to one embodiment of the present invention will be described below, specifically referring to FIGS. 1 to 31. The printing material and the coating material are a substrate P and a printing paste, respectively.

Feed-in unit and feed-out unit

Figure 1:
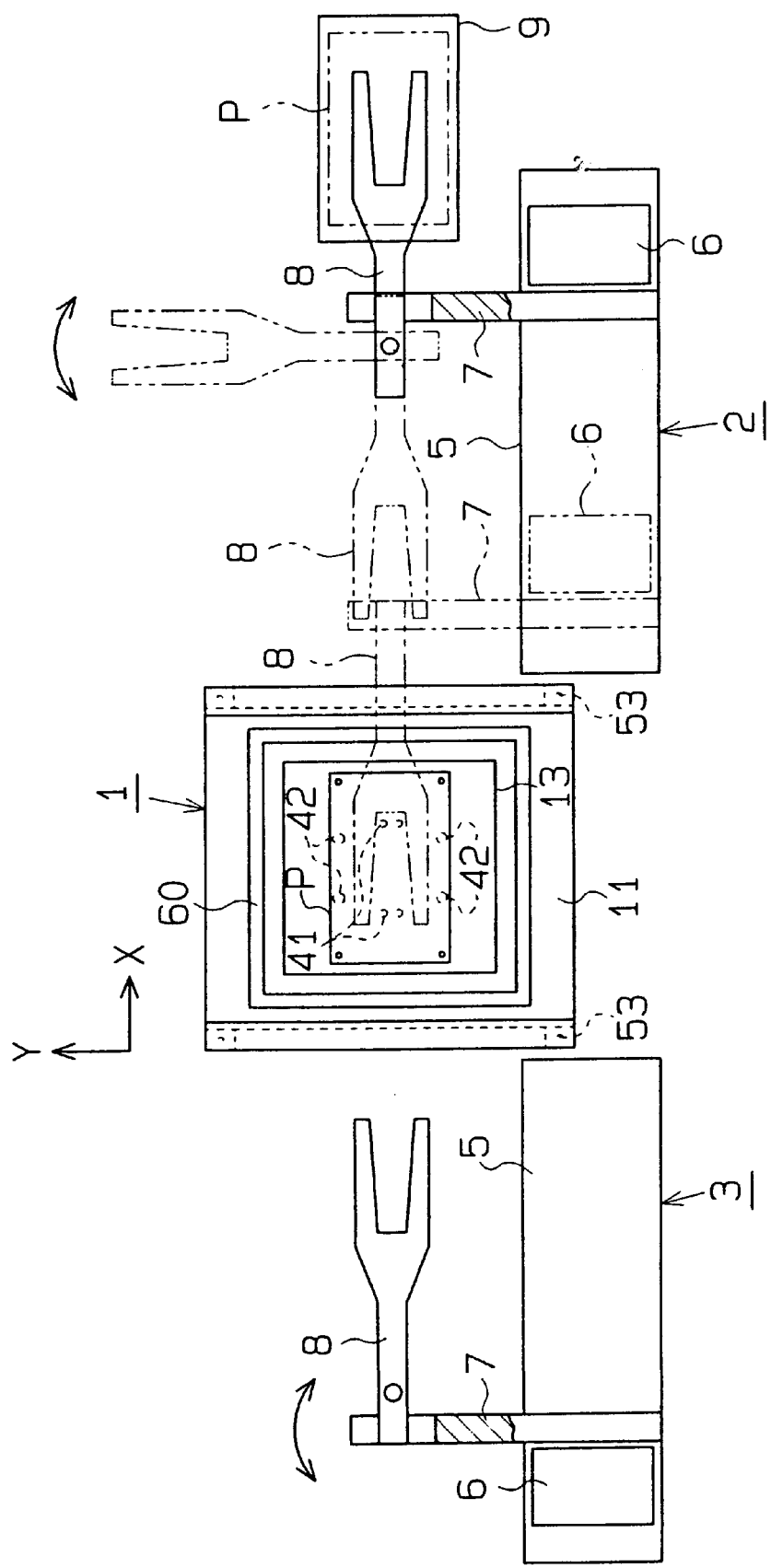
FIG. 1 is a schematic plan view showing the screen printing apparatus according to one embodiment of the present invention and the relationship between the feed-in unit and the feed-out unit.
Figure 2:
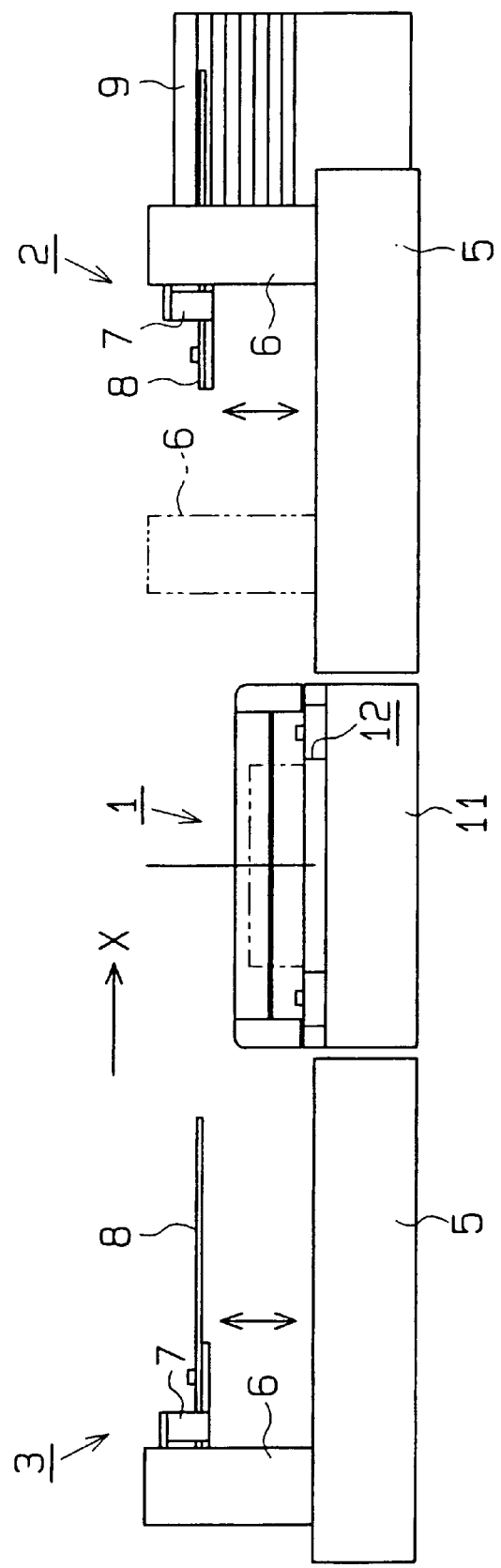
FIG. 2 is a schematic side view of the apparatus shown in FIG. 1.

FIGS. 1 and 2 show, respectively, in schematic plan view and schematic side view, a screen printing apparatus 1 and the relationship between a feed-in unit 2 and a feed-out unit 3.

The feed-in unit 2 and the feed-out unit 3 are located on the upstream side and on the downstream side of the screen printing apparatus 1, respectively. Since these two units 2 and 3 are the same, only the feed-in unit 2 will be described here. In the feed-out unit 3, corresponding components are affixed with the same reference numerals, and their descriptions are omitted.

The feed-in unit 2 consists of a movable post 6 (which is moved by a drive motor, not shown) attached to a base 5 to be movable in the longitudinal direction, an ascending arm 7 (which is moved by a drive motor, not shown) attached to the movable post 6 for movement in the vertical direction, and a fork 8 (which is turned by a drive motor, not shown) attached to the distal end portion of the ascending arm 7. The fork 8 is able to turn within the range of 180° in the positive and negative directions on the horizontal plane of the arm 7.

Incidentally, the reference numeral 9 denotes a rack having a plurality of shelf boards for storing a predetermined number of substrates P thereon, and each substrate P is mounted on protrusions (not shown) formed on each shelf board.

Regarding the feed-in unit 2, the steps of picking up of a substrate P from the rack 9 to feed it into the screen printing apparatus 1 are as follows:

(1) The fork 8 is inserted into a space defined between a shelf board and a substrate P to be picked up, which is mounted on the protrusions of that shelf board (the state of the fork 8 depicted by the solid line in the right side of FIG. 1);

(2) The fork 8 is lifted a little to lift the substrate P from the shelf board and is then turned by 180°;

(3) The fork 8 is ascended to a level slightly higher the mounting face 18a of a table 13 in an X-Y-theta (θ) table unit 12 (to be described later), and then the movable post 6 is moved until the substrate P mounted on the fork 8 is carried above the table 13 (the state of the fork 8 located above the table 13 as depicted by the two dash-dotted line in FIG. 1).

When the substrate P on the table 13 is to be carried out by the feed-out unit 3, the unit 3 is operated in the reversed order.

Screen printing apparatus

In the embodiment shown in the Figures, the screen printing apparatus 1 is provided with a printing mechanism 52, an X-Y-theta (θ) table unit 12, a film thickness detector 91 and a printing position detecting device.

First, the X-Y-theta (θ) table unit (hereinafter referred to as table unit) 12 will be described.

X-Y-theta (θ) table unit

Figure 8:
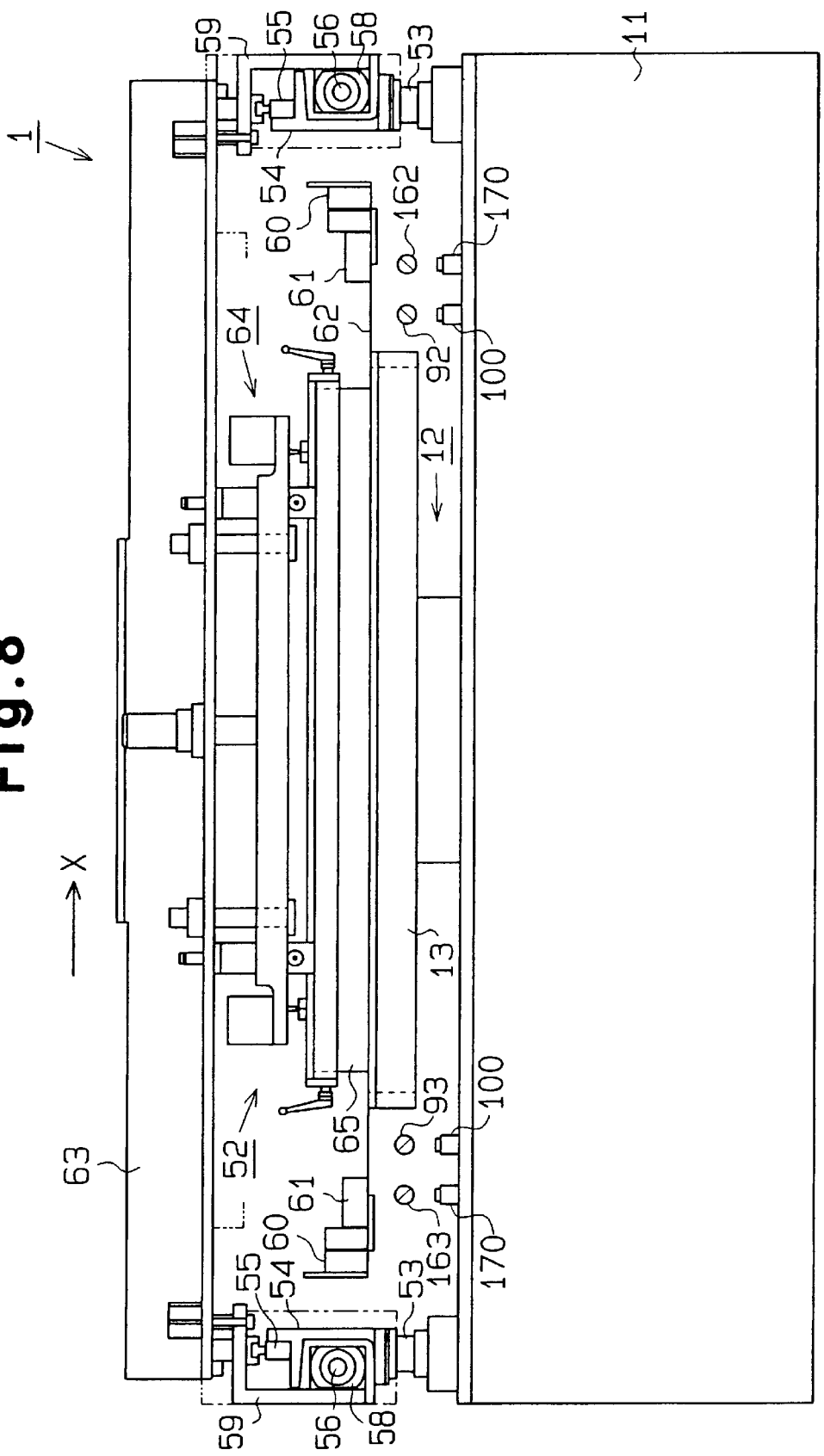
FIG. 8 is also a side view of the pertinent portion of the screen printing apparatus taken in the Y direction.

As shown in FIG. 8, the screen printing apparatus 1 is provided with a table unit 12 at the top of the main body 11. This table unit 12 serves as a relative position adjusting means for mounting and immobilizing a substrate P during printing.

Figure 12:
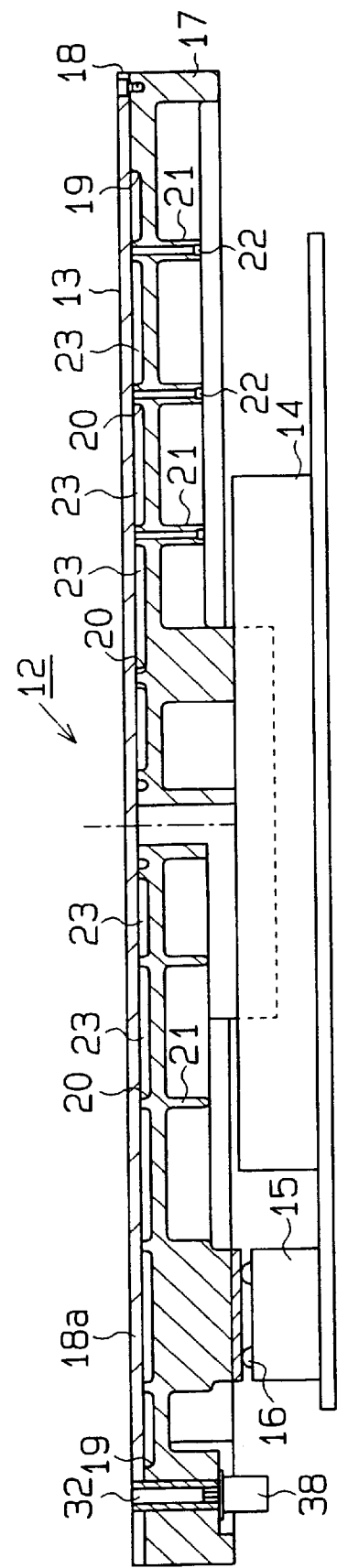
FIG. 12 is a cross-sectional view taken along the line 12—12 in FIG. 13.

As shown in FIG. 12, the table 13 of the table unit 12 is pivotally supported by a bearing body 14 and is also connected to and driven by a drive motor (not shown). The drive motor is provided with a rotary encoder, which can detect the degree of rotation. The bearing body 14 is incorporated into the main body 11 and is movable in the X and Y directions. Further, the bearing body 14 has in the four corners of the flange thereof, table supports 15, each having a bearing 16 for supporting the table 13.

The table 13 consists of a table base 17, having a square plan view, and a top plate 18 fixed on the table base 17. The upper surface of the top plate 18 provides a planar mounting face 18a. The table base 17 has on its upper surface an upwardly protruding (see FIG. 12). Further, the table base 17 has on the upper surface thereof, surrounded by the peripheral wall 19, generally grid-like ribs 20, and on the lower surface thereof, reinforcing ribs 21 protruding downward. The top plate 18 is fixed tightly onto the upper ends of the peripheral wall 19 and of the ribs 20 by fixing bolts 22 screwed upward through intersections of the grid-like ribs 20 (and through the peripheral wall 19) into the top plate 18. Incidentally, in FIG. 12, only the fixing bolts 22 screwed upward through intersections of the grid-like ribs 20 are shown.

Figure 13:
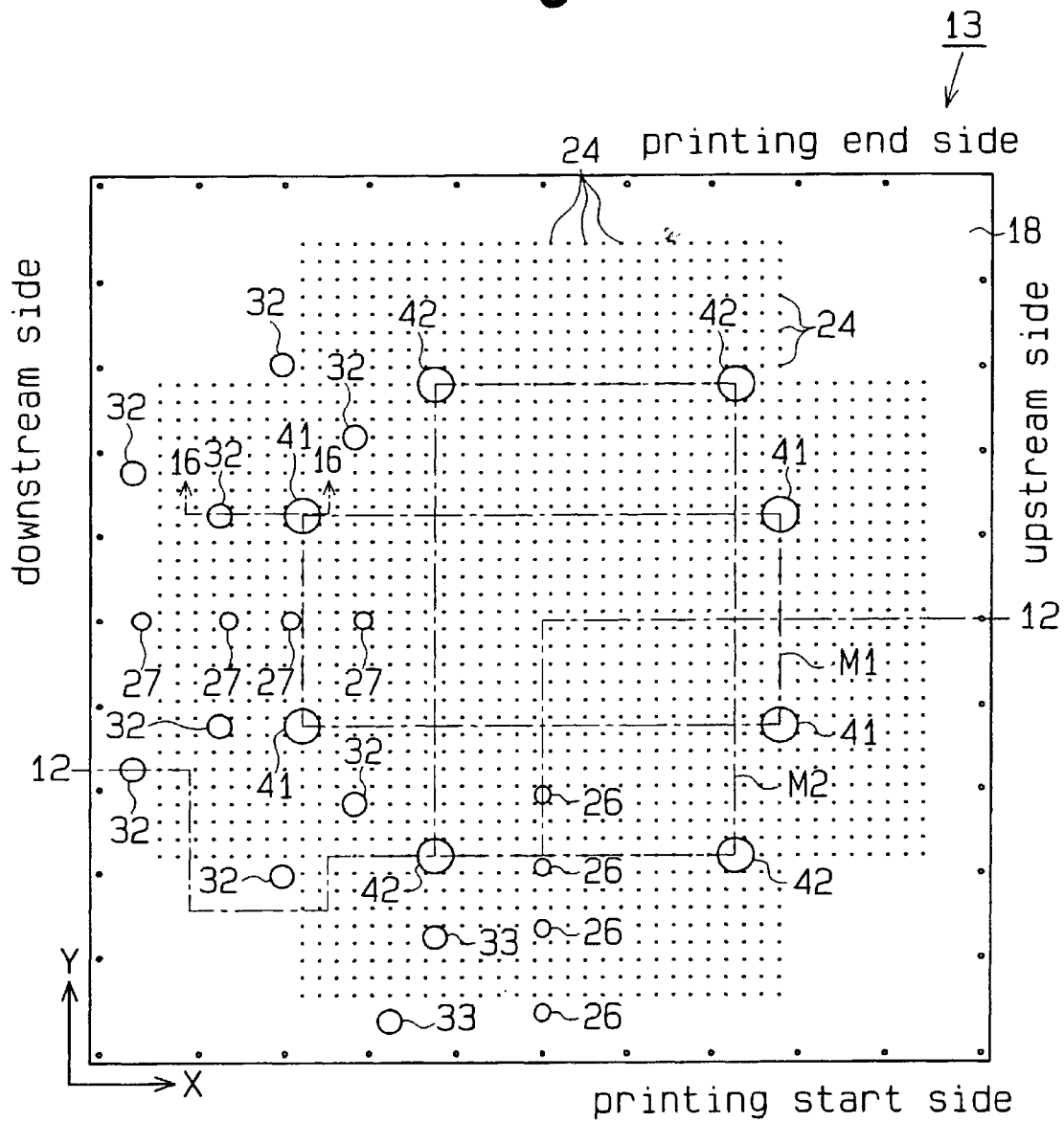
FIG. 13 is a plan view showing mutual relationship between the table and lift pins incorporated thereto in the screen printing apparatus.

Suction chambers 23, which are defined by the lower surface of the top plate 18, the upper surface of the table base 17, the peripheral wall 19 and the ribs 20, communicate with one another via communication holes (not shown) defined in the ribs 20. As shown in FIG. 13, the top plate 18 contains a multiplicity of suction holes 24 arranged in a matrix-like form, and the suction holes 24 communicate with the corresponding suction chambers 23. Since the suction chambers 23 are connected to a first vacuum pump 77 (see FIG. 26) via suction pipes (not shown), the air in each suction chamber 23 is drawn by driving the first vacuum pump 77.

Figure 14:
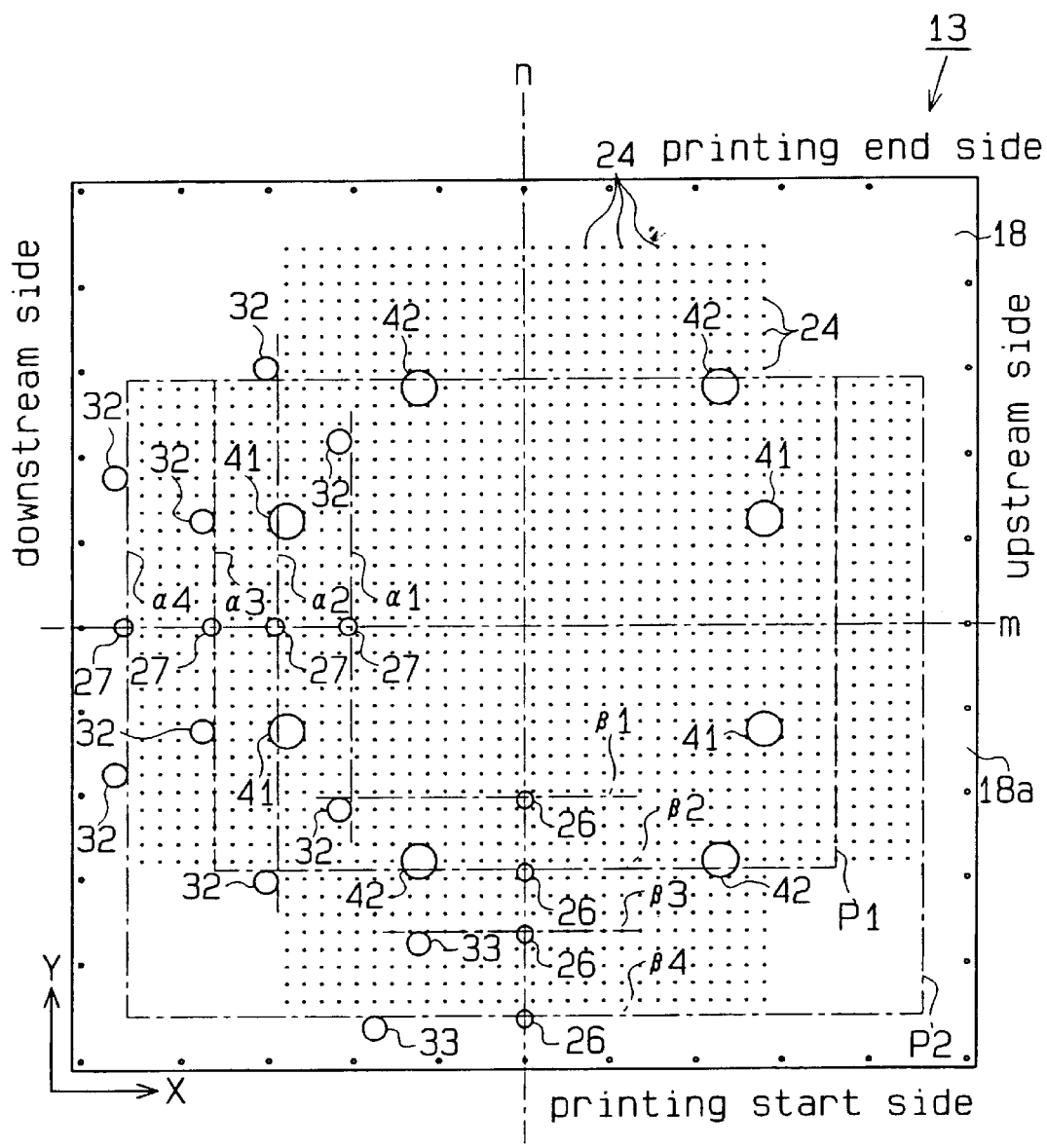
FIG. 14 is a plan view showing the mutual relationship between the table, and material presence sensors and positioning pins incorporated thereto in the screen printing apparatus.
Figure 15:
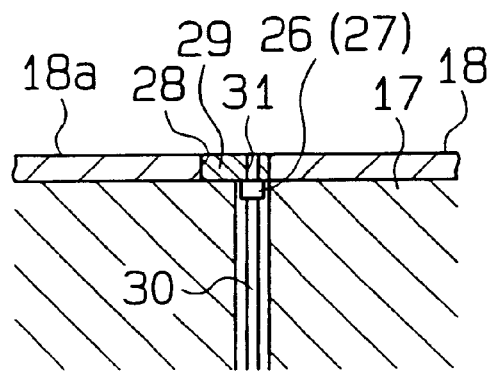
FIG. 15 is a partial cross-sectional view showing the material presence sensor is fitted to the table.

Meanwhile, as shown in FIGS. 13 and 14, a plurality of material presence sensors 26 and 27 (four of each in the Figures) are arranged at predetermined intervals. Four sensors 26 are arranged on the center line n (see FIG. 14) with respect to the dimension X of the top plate 18 in the printing start side zone, and four sensors 27 are arranged on the center line m (see FIG. 14) with respect to the dimension Y of the top plate 18 in the downstream side zone. As shown in FIG. 15, the material presence sensors 26 and 27 are each fixed onto the lower surfaces of fixing pieces 29 fitted in fitting holes 28 defined in the top plate 18. The material presence sensors 26 and 27 are reflection type optical sensors and are each connected to a central processing unit (CPU) 71 to be described later via optical fibers 30. The reference numeral 31 denotes a through hole defined in each fixing piece 29 to provide a light path for light emitted from the sensors 26 and 27 and for the reflected light thereof. The sensors 26,27 as shown in FIGS. 13 and 14 are actually the fixing pieces 29 on which the material presence sensors 26 and 27 are to be attached, and the through hole 31 of each fixing piece 29 serving as a light path is positioned on the center line m or n.

A pair of positioning pins 32 are arranged with respect to each material presence sensor 27, one on each side of the center line m in symmetry. More specifically, as shown in FIG. 14, the positioning pins 32 are arranged at positions such that they ate tangential to lines alpha 1 (α1) to alpha 4 (α4), which intersect with the line m at right angles.

Meanwhile, two positioning pins 33, which are downstream side of the center line n are similarly arranged with the first two material presence sensors 26 located on the printing start side. The first two positioning pins 32 counted from the center line n and from the printing start side are similarly arranged with the other two material presence sensors 26. As shown in FIG. 14, these positioning pins 32 and 33 are tangential to lines beta 1 (β1) to beta 4 (β4), which intersect at right angles with the line n.

Figure 16:
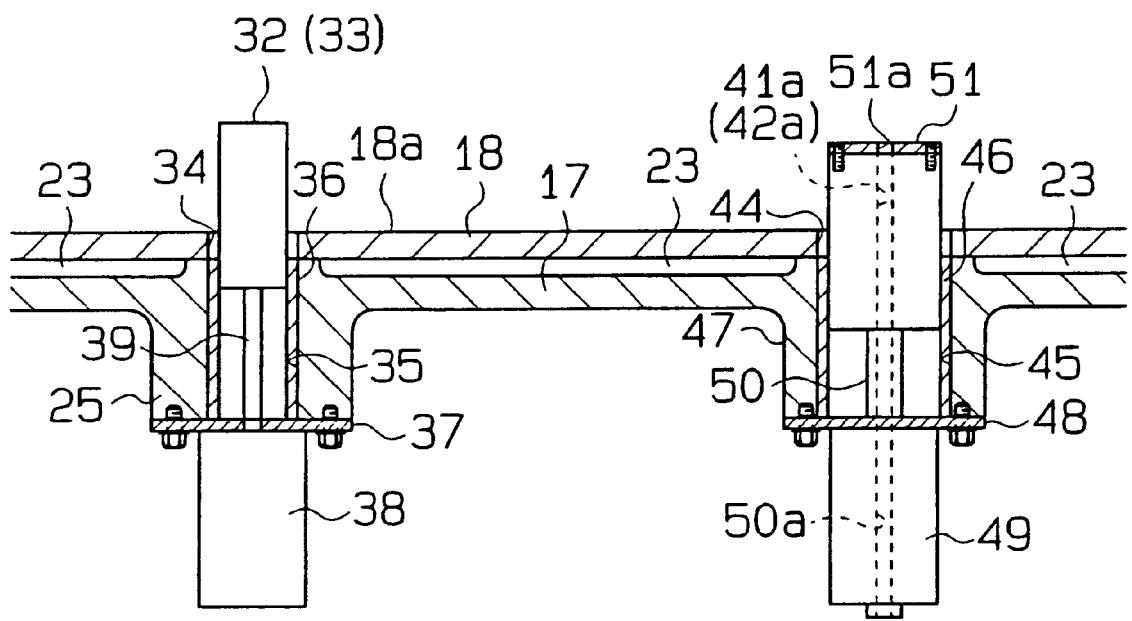
FIG. 16 is a cross-sectional view, taken along the line 16—16 in FIG. 13, showing the positioning pin and the lift pin are fitted to the table and also actions of these pins.

Each of these positioning pins 32 and 33 is, as shown in FIG. 16 (a cross-sectional view taken along the line 16—16 in FIG. 13), slidably attached to a runner 36 fitted in through holes 34 and 35, which are defined in the top plate 18 and the table base 17. The reinforcing ribs where positioning pins 32 and 33 are located have expanded portions 25. Incidentally, in FIG. 16, the reinforcing ribs 21 are not shown since they extend in the direction perpendicular to the sheet plane. Air cylinders 38 are attached to the lower ends of the expanded portions 25 via fitting plates 37, and the positioning pins 32 and 33 are connected to the distal ends of rods 39 of the cylinders 38. When the air cylinders 38 are operated in the positive and negative directions, the rods 39 are reciprocated vertically to allow the positioning pins 32 and 33 to assume protruded positions (see FIG. 16) and retracted or flush positions (see FIG. 12) with respect to the top plate 18, respectively. Accordingly, when selected positioning pins 32 and 33 are the protruded, the substrate P mounted on the table 13 is abutted at the downstream side thereof against the sides of the pins 32 and 33 and is positioned by them, and the material presence sensors 26 and 27 closest to the center of the table 13 to the sensors 26 and 27 corresponding to these positioning pins all output "ON" detection signals showing that material is present.

Further, as shown in FIG. 13, lift pins 41 and 42, which serve as a means for lifting the substrate P, are arranged at positions corresponding to four corners of rectangles M1 and M2, each having different X and Y dimensions. These lift pins 41 and 42 are arranged such that they do not interfere with the forks 8 of the feed-in unit 2 and the feed-out unit 3 when the forks 8 are located above the table 13, as shown in FIG. 1 (FIG. 1 shows the state where the fork 8 of the feed-in unit 2 has carried in a substrate P). Incidentally, the length of the side in the X direction of the rectangle M1 is greater than that of the rectangle M2, whereas the length of the side in the Y direction of the rectangle M1 is smaller than that of the rectangle M2. Further, as shown in FIG. 14, the lift pins 41 and 42 are arranged symmetrically on each side of the center line m. The arrangement described above enables mounting of various sizes of substrates on the lift pins 41 and 42.

The lift pins 41 and 42, like the positioning pins 32 and 33, are slidably attached to runners 46 fitted in through holes 44 and 45 defined is the top plate 18 and the table base 17. The reinforcing ribs 21 (not shown in FIG. 16) where lift pins 41 and 42 are located have expanded portions 47. Air cylinders 49 are attached to the lower ends of the expanded portions 47 via fitting plates 48, and the lift pins 41 and 42 are connected to the distal ends of rods 50 of the cylinders 49. When the air cylinders 49 are operated in the positive and negative directions, the rods 50 are reciprocated vertically to allow the lift pins 41 and 42 to assume lifted positions (see FIG. 16) and retracted or flush positions with respect to the top plate 18. The upper end faces of the lift pins 41 and 42 are each covered with a sheet 51 made of a resilient material such as a silicone rubber. Further, the length of protrusion of the lift pins 41 and 42 from the mounting face 18a of the table 13 is smaller than the length of protrusion of the positioning pins 32 and 33 from the mounting face 18a of the table 13. This difference in the quantity of protrusion enables abutment of sides of the substrate P with the sides of the positioning pins 32 and 33. Incidentally, the length of protrusion of the lift pins 41 and 42 is greater than the thickness of the fork 8 of the feed-in unit 2 and the feed-out unit.

Through holes 51a, 41a, 42a and 50a are defined through the sheet 51 and through the lift pins 41 or 42 and the rod 50 along the axis common to them, and the lower extremity of the through hole 50a is connected via a suction pipe (not shown) to a second vacuum pump 79. These through holes 51a, 41a, 42a and 50a, the suction pipe and the second vacuum pump 79 constitute a material vacuum means.

Printing mechanism

Next, a printing mechanism 52 will be described.

As shown in FIG. 8, stanchions 53 stand in the four corners of the upper surface of the main body 11, respectively. A pair of rail supporting frames 54 are extended in the Y direction across two pairs of stanchions 53 (perpendicular to the plane of the page of FIG. 8), and rails 55 are fixed thereon, respectively. The stanchions 53 are connected, via ascending/descending mechanisms, to ascending/descending drive motors 57 (see FIG. 26), so that the stanchions are ascended or descended as the ascending/descending drive motors 57 are revolved in the positive or negative directions. Incidentally, each ascending/descending drive motor 57 is provided with a rotary encoder, which detects the degree of rotation.

The ascending drive motors 57, the ascending/descending mechanisms (not shown), the stanchions 53, and carrier frames 59 to be described later. constitute screen supporting means.

A ball screw 56 is supported in each supporting frame 54 to extend in the Y direction and is connected to a carrying drive motor (not shown). Further, the ball screw 56 is engaged with a nut 58 on which the carrier frame 59 is fixed. The upper part of the carrier frame 59 is slidably fitted on the rail 55. The nut 58 moves horizontally along the rail 55 as the carrying drive motor is driven according to printing conditions so as to move the carrier frame 59 in the Y direction.

A rectangular printer frame 60 is attached to the supporting frame 54 to be positioned above the table unit 12 (for convenience, the structure connecting the rail supporting frame 54 and the printer frame 60 is not shown in FIG. 8).

A rectangular screen frame 61 larger than the table 13 is supported at the inner lower sides of the printer frame 60, and a screen 62 having a predetermined masking is extended on the lower end of the screen frame 61. The screen 62 is a woven fabric and has an emulsion coating film formed on the surface thereof. This screen 62 is moved closer to or farther from the table 13 as the printer frame 60 is ascended or descended. Upper limit switches 78 (see FIG. 26) are located adjacent to the stanchions 53 and are actuated depending on the operational position of the stanchions 53 when the printer frame 60 is located at the uppermost position. The upper limit switches 78 output "ON" signals when the printer frame 60 is located at the uppermost position.

As shown in FIG. 8, a bracket 63 constituting a printer head frame extends above and across the two carrier frames 59. A squeegee 65 for applying a printing paste is supported by the bracket 63 via a squeegee supporting mechanism 64. This bracket 63 also supports a scraper (not shown) via a scraper supporting mechanism (not shown).

Film thickness detector

Next, a film thickness detector 91 will be described referring to FIGS. 7, 8, 10, 11 and 17 to 19.

Figure 10:
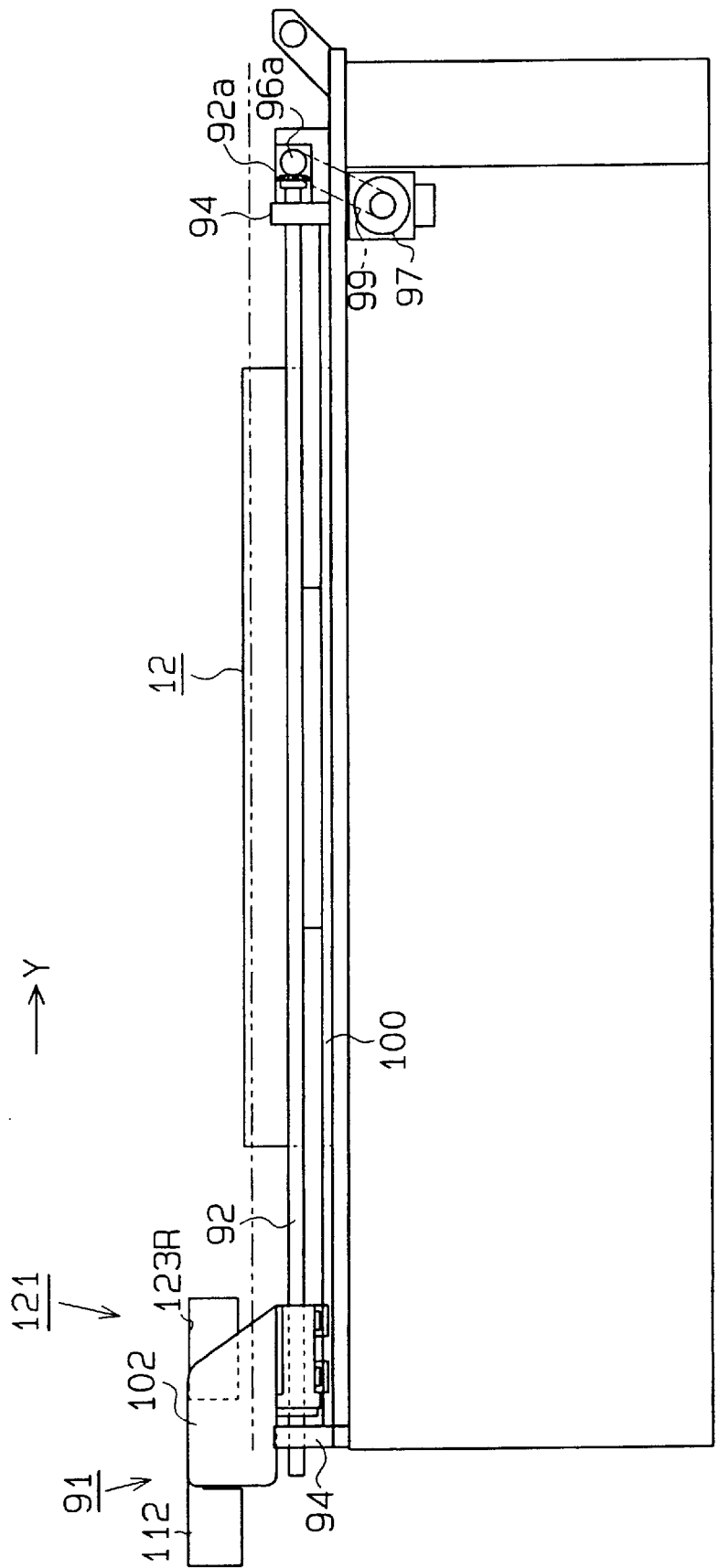
FIG. 10 is a side view of the first printing position detecting unit and the film thickness detector in the screen printing apparatus taken in against the X direction.
Figure 11:
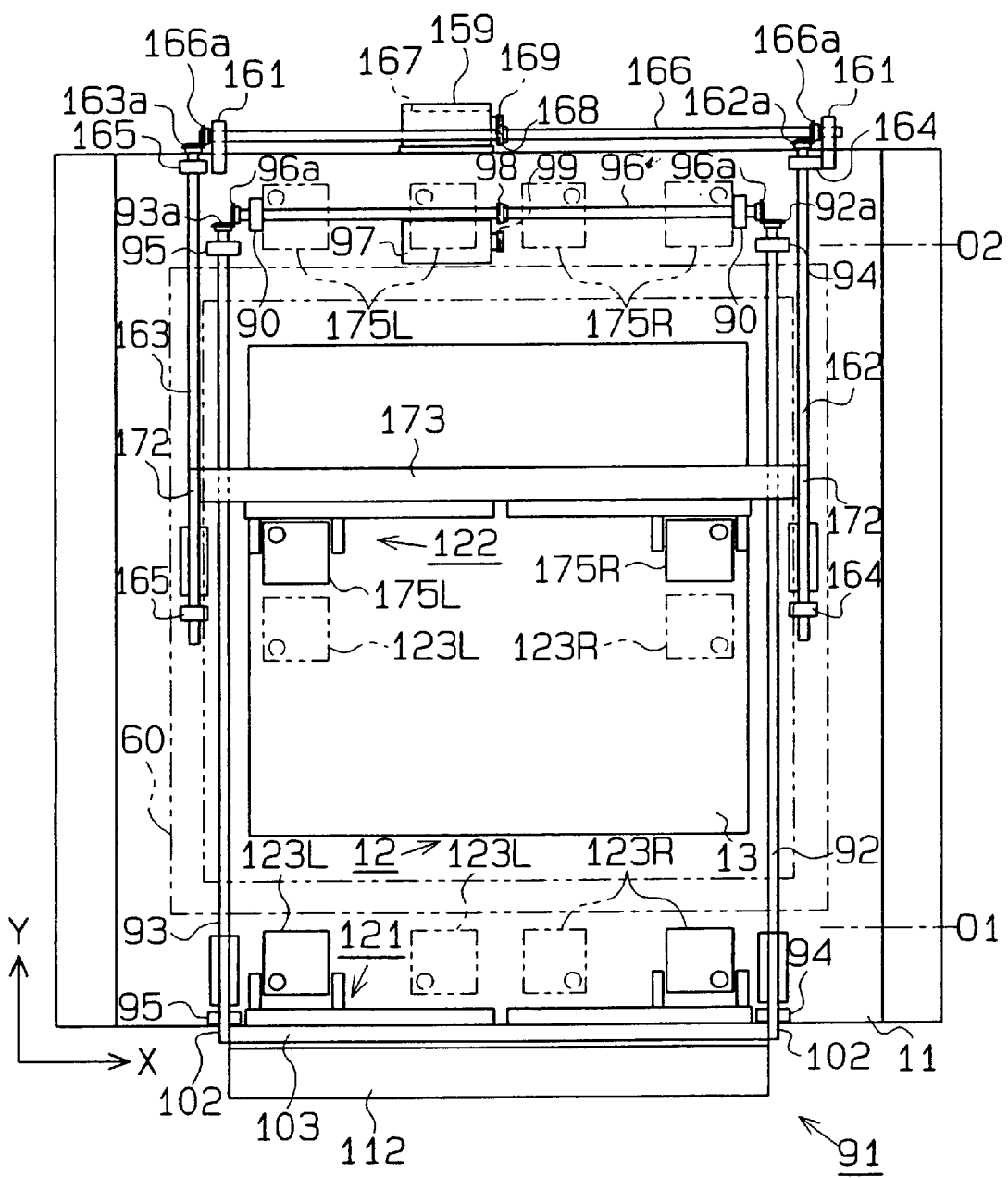
FIG. 11 is a plan view showing arrangement of the first printing position detecting unit, the second printing position detecting unit and the film thickness detector in the screen printing apparatus and ranges of movement thereof.

As shown in FIGS. 10 and 11, a pair of ball screws 92 and 93 are rotatably supported by bearings 94 and 95, respectively, to extend on the main body 11 in the Y direction on each side of the table unit 12 and substantially over the entire length of the main body 11. Bevel gears 92a and 93a are fixed to the distal ends of the ball screws 92 and 93, respectively. A rotary shaft 96 is rotatably supported on the main body 11 via bearings 90 to extend in the X direction connecting the distal ends of the screws 92 and 93. The rotary shaft 96 has bevel gears 96a fixed to each end, which are meshed with the bevel gears 92a and 93a of the ball screws 92 and 93, respectively. A Y axis drive motor 97, which is a step motor capable of revolving in the positive and negative directions, is located in the main body 11, and a pulley is fixed to its output shaft. A timing belt 99 is wrapped around the pulley, and another pulley 98, is fixed at the middle of the rotary shaft 96. Accordingly, the rotary shaft 96 is driven to rotate by the revolution of the Y axis drive motor 97 via the timing belt 99, and the driving torque is transmitted via the bevel gears 96a, 92a and 93a to the ball screws 92 and 93. The Y axis drive motor 97 is provided with a rotary encoder so that the degree of rotation of the motor 97 may be detected.

These Y axis drive motor 97, the rotary shaft 96, and ball screws 92 and 93. constitute a Y direction moving means.

Figure 7:
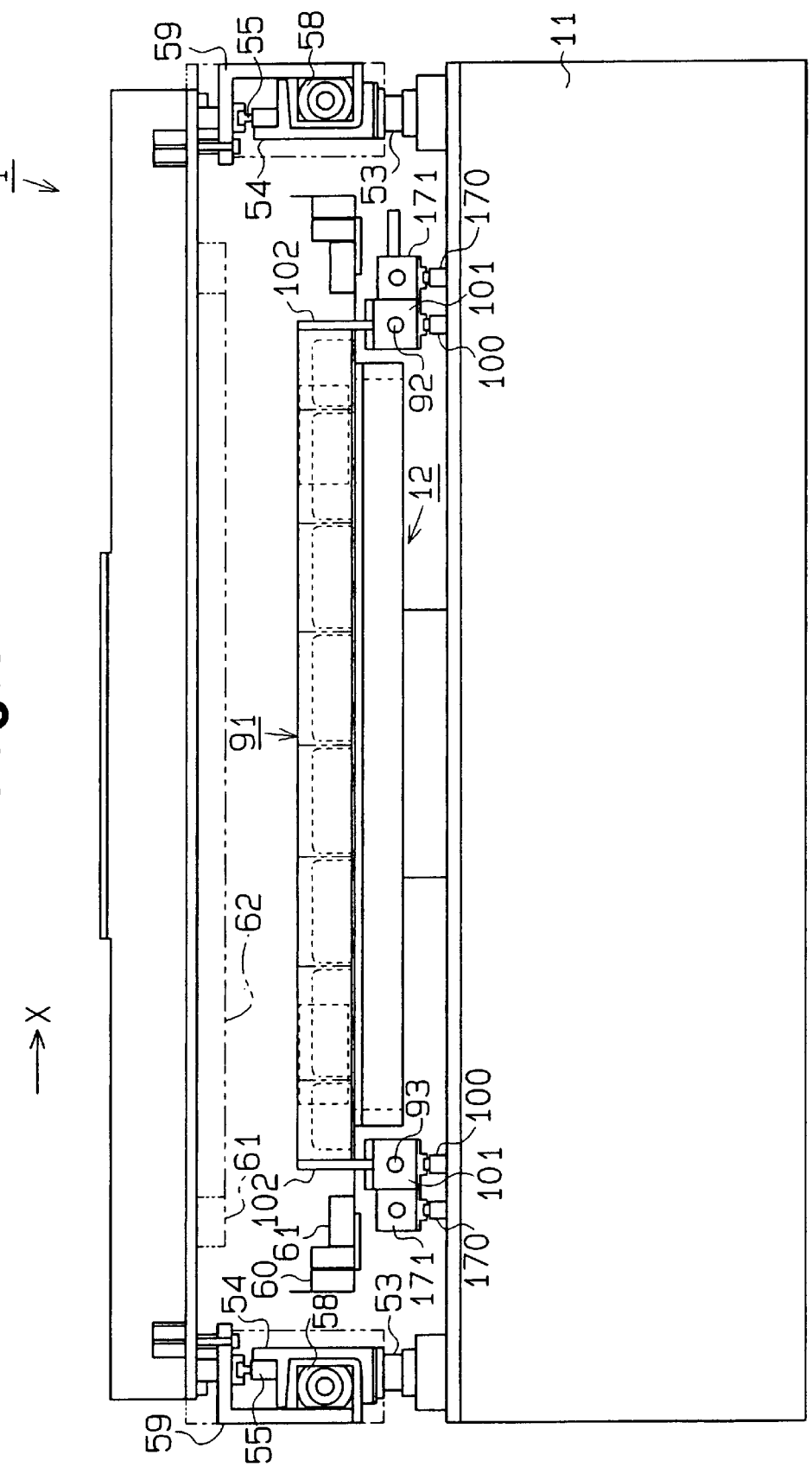
FIG. 7 is a side view of the pertinent portion of the screen printing apparatus taken in the Y direction.

As shown in FIGS. 7, 8 and 10, a pair of guide rails 100 are provided on the main body 11 and below the ball screws 92 and 93, respectively, to extend in the Y direction. The film thickness detector 91 is slidably attached to these guide rails 100.

Figure 17:
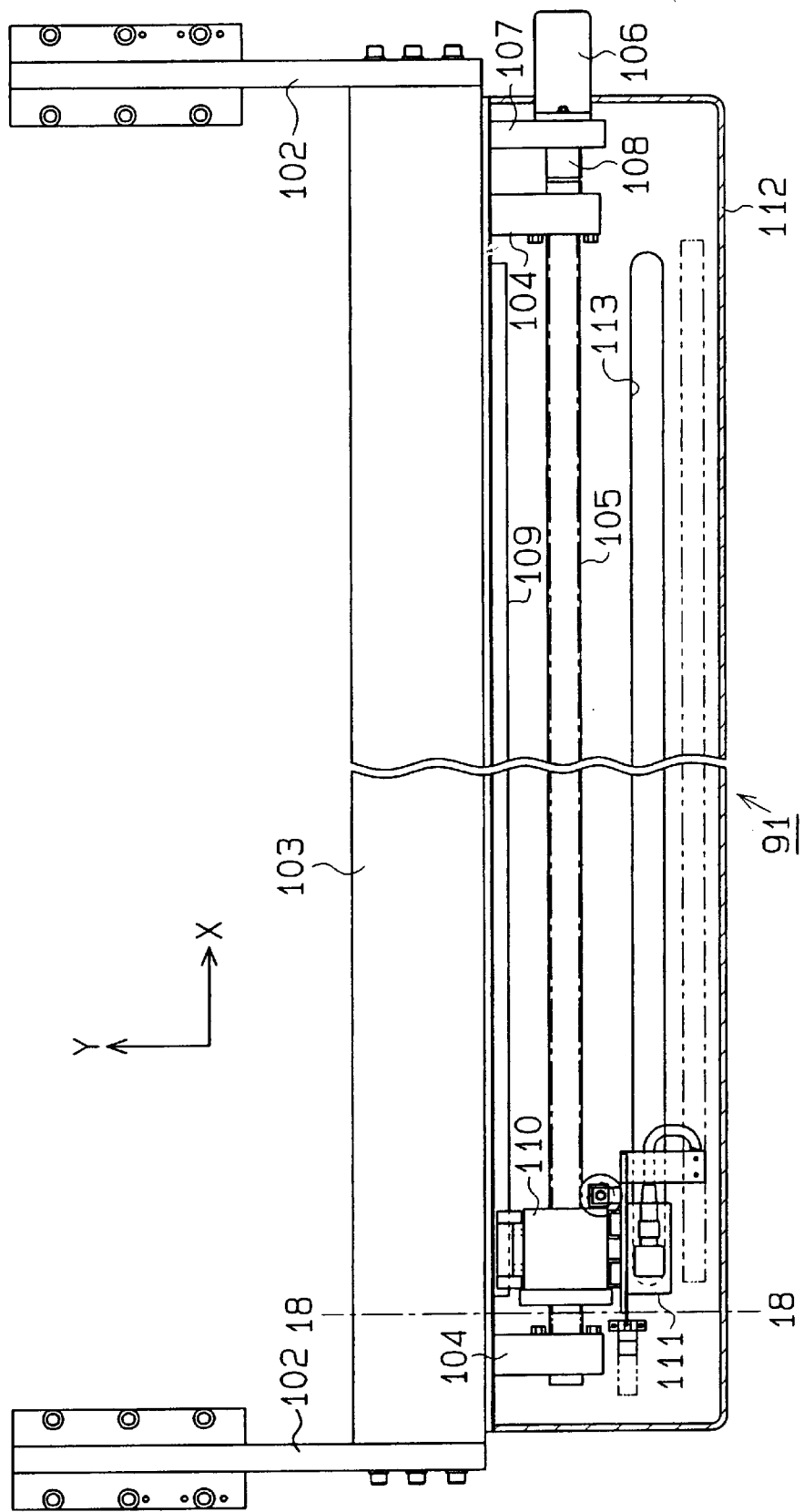
FIG. 17 is a cross-sectional view, taken along the line 17—17 in FIG. 19.
Figure 19:
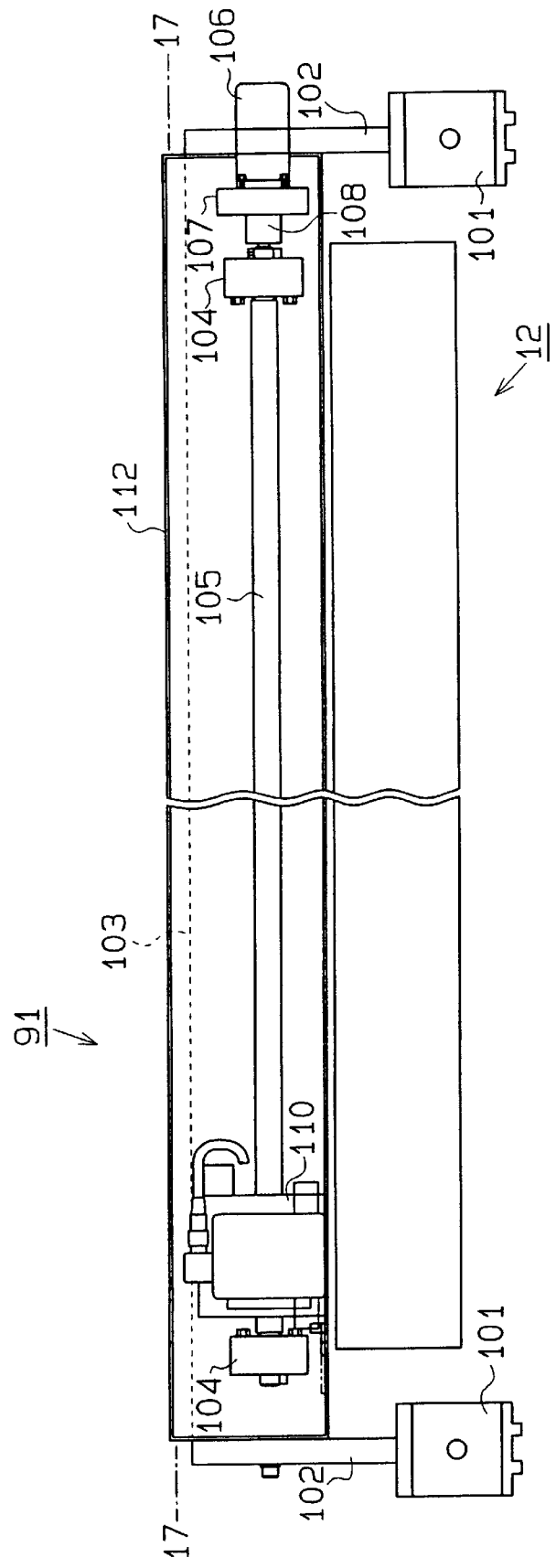
FIG. 19 is a cross-sectional view, taken along the line 19—19 in FIG. 18.

The film thickness detector 91 has sliders 101 (see FIG. 7), the bottoms of which are slidably engaged with the guide rails 100. The sliders 101 are engaged with the ball screws 92 and 93. Accordingly, the sliders 101 positively and negatively in the Y direction as the ball screws 92 and 93 rotate in the positive and negative directions. Side plates 102 stand on the sliders 101, and a transverse part 103 extends between the side plates 102 as shown in FIG. 17. A ball screw 105, which is shorter than the transverse part 103, is rotatably supported at each by a pair of bearings 104 to extend along the transverse part 103. An X axis drive motor 106 is fixed to the transverse part 103 via a bracket 107, and its output shaft is connected via a coupling 108 to the distal end portion of the ball screw with respect to the X direction. An X axis drive motor 106 is a step motor capable of revolving in the positive and negative directions. The X axis drive motor 106 is provided with a rotary encoder so that its degree of rotation can be detected.

Further, a guide rail 109 extending in the X direction is secured along one side of the transverse part 103 as shown in FIG. 17. The ball screw 105 is screwed into a sensor support 110, which is slidably fitted on a guide rail 109. Meanwhile, a film thickness sensor 111 is supported on the sensor support 110. The film thickness sensor 111 is conventional and has a laser irradiating section, which emits a downward laser beam (with reference to FIG. 18) to detect the thickness of the coating film of a printing paste applied on a substrate P based on the reflected light from the substrate P. A cover 112 for covering the ball screw 105, the guide rail 109, and the sensor 111 is attached to the transverse part 103. The cover 112 has a window 113, which is defined at the bottom to extend in the X direction. The window 113 passage of the laser beam emitted by the film thickness sensor 111 and its reflected light.

These elements 92 to 112 constitute the film thickness detector 91.

Figure 5:
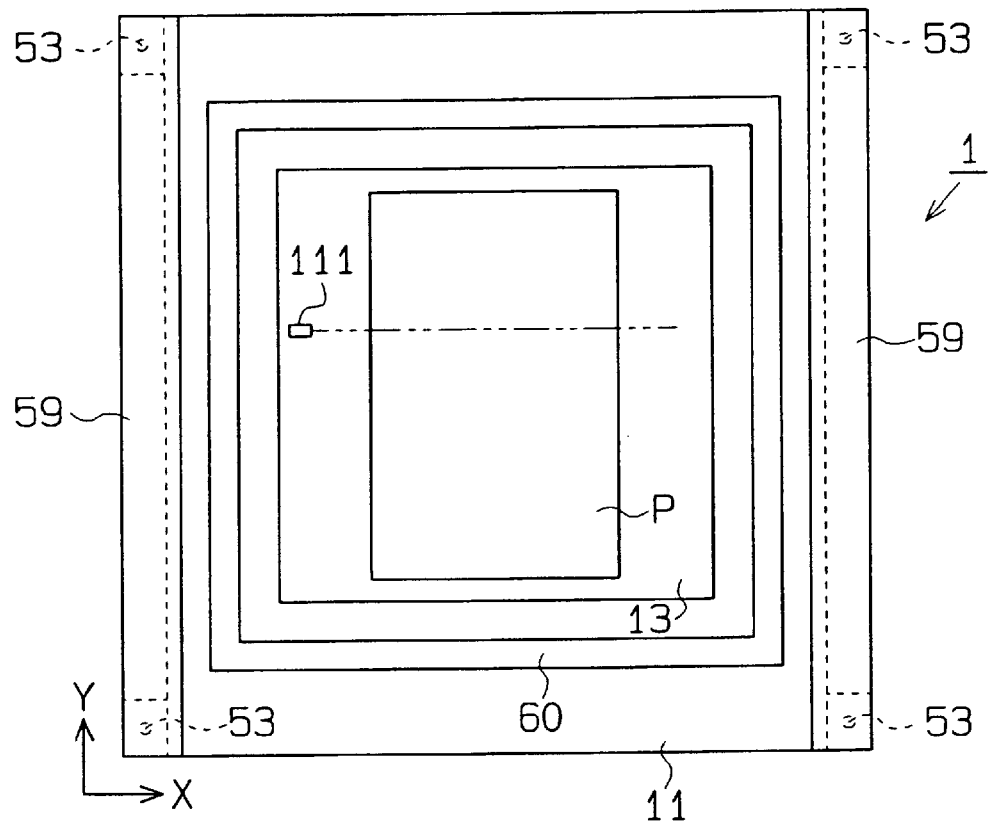
FIG. 5 is a plan view for illustrating movement of a film thickness detector in the X and Y directions in the screen printing apparatus.

This film thickness detector 91 can be moved substantially over the entire width of the table 13 of the table unit 12 in the positive and negative X direction under power of the X axis drive motor 106, as shown in FIG. 5.

The X axis drive motor 106, the ball screw 105, and the sensor support 110, constitute an X direction moving means.

Printing position detecting system

Next, a printing position detecting system will be described.

The printing position detecting system consists of a first printing position detecting unit 121 and a second printing position detecting unit 122, as shown in FIG. 11.

The first printing position detecting unit 121 will be described first.

The first printing position detecting unit 121 has a pair of CCD cameras 123R and 123L, each constituting a first and second alignment mark detecting means, provided on the transverse part 103.

The structure of supporting the CCD cameras 123R and 123L will be described in detail referring to FIGS. 20 to 24.

Since the supporting structure of the CCD camera 123L and that of the CCD camera 123R are the same and they are mirror images of one another, only the structure of the CCD camera 123L in FIG. 11 will be described.

Figure 20:
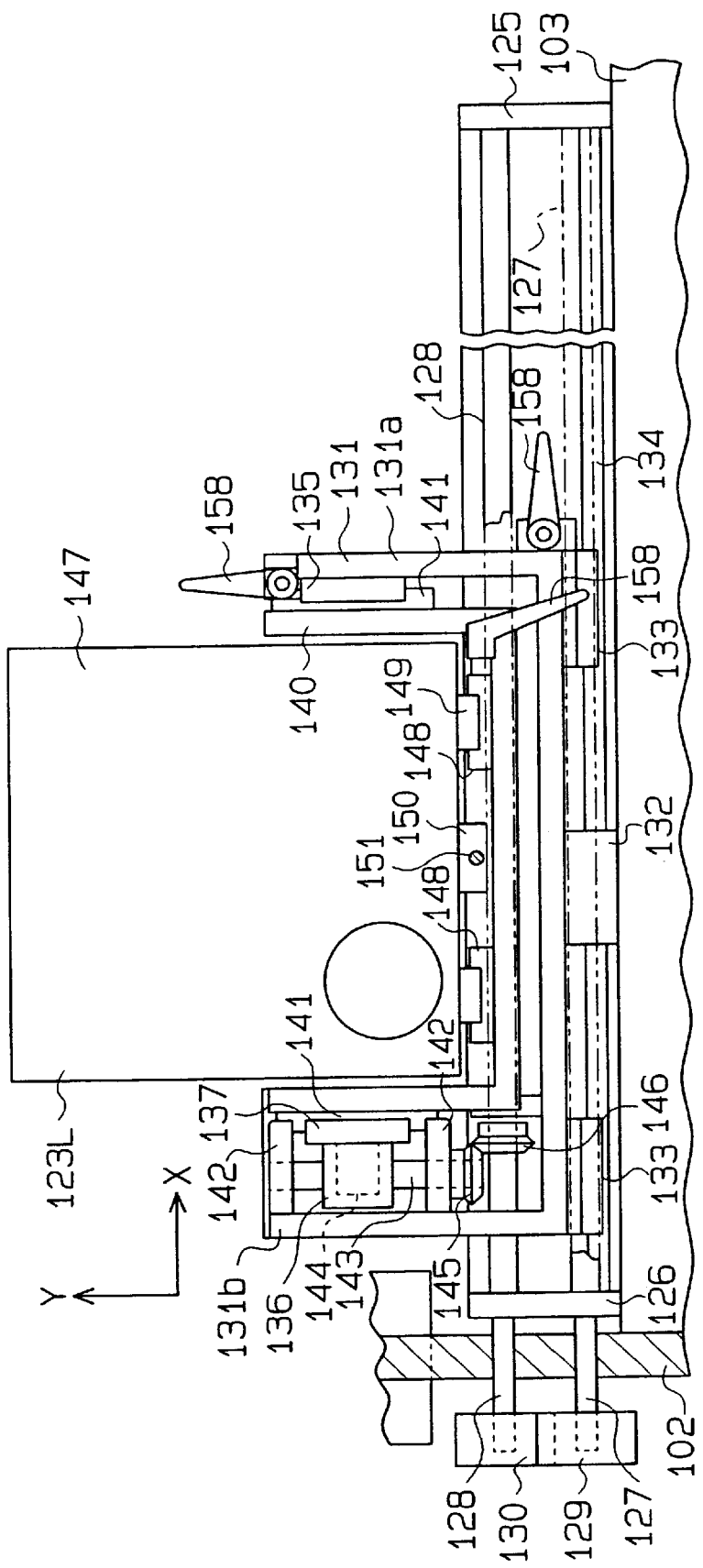
FIG. 20 is a plan view showing a structure on which the CCD camera is supported.
Figure 23:
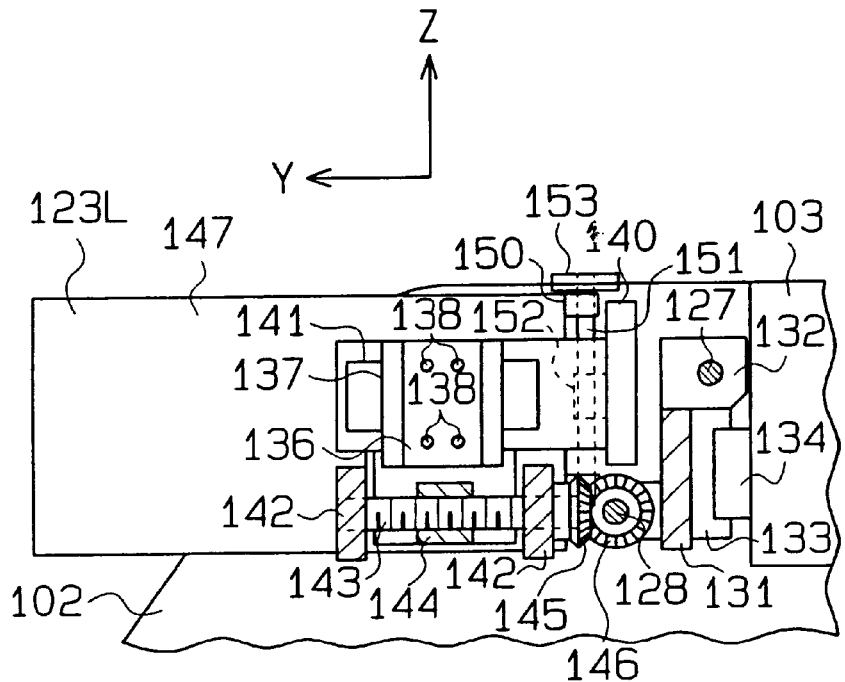
FIG. 23 is a cross-sectional view of a pertinent portion of the structure on which the CCD camera is supported.

In FIG. 20, a pair of bearings 125 and 126 are fixed on the transverse part 103. Further, as shown in FIGS. 20 and 23, these bearings 125 and 126 also rotatably support an X direction adjusting shaft 127 and a Y direction adjusting shaft 128. As shown in FIG. 20, the proximal end portions of these adjusting shafts 127 and 128 protrude outward through the side plate 102, and operating knobs 129 and 130 for enabling manual operation of these shafts 127 and 128 are fixed to these protruding end portions.

Figure 21:
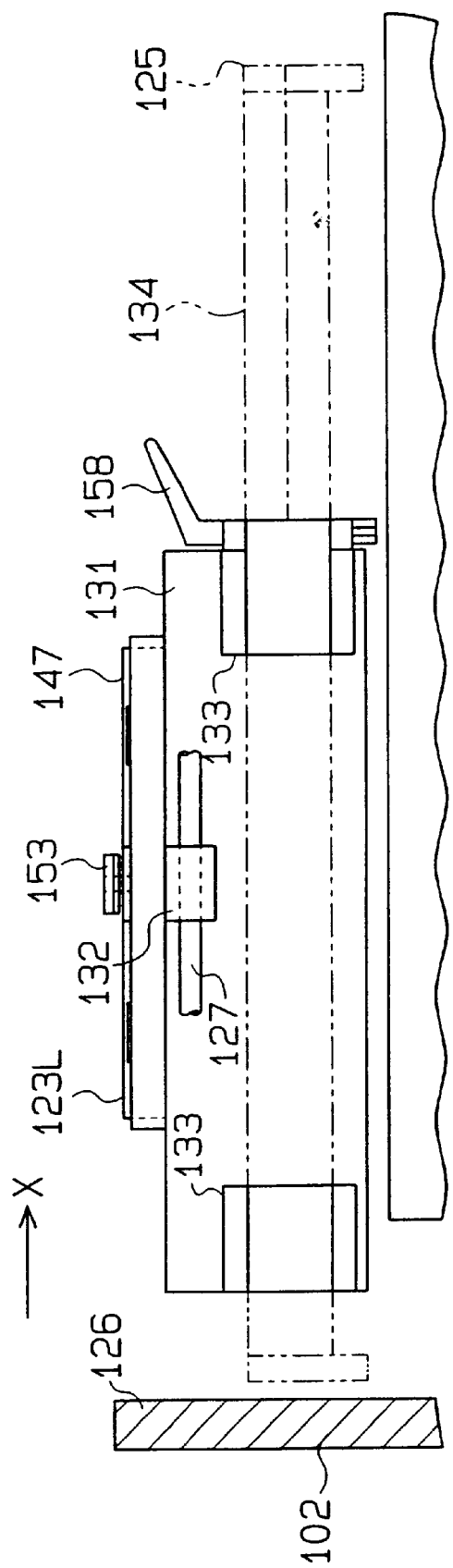
FIG. 21 is a rear view showing the structure on which the CCD camera is supported.

As shown in FIGS. 20 and 21, a channel-like outer frame 131 has on its rear face a nut 132 into which the X direction adjusting shaft 127 is screwed. Further, a pair of sliders 133 are provided on the rear face of the outer frame 131. The sliders 133 are slidably fitted on a guide 134 fixed to the transverse part 103 to extend in the X direction. Accordingly, when the X direction adjusting shaft 127 is rotated, the outer frame 131 is moved in the X direction being guided by the guide 134.

Another slider 135 is fixed on an inner wall of the inner part 131a (the right part in FIGS. 20 and 22) of the outer frame 131. Further, another slider 137 is fixed on an inner wall of the outer part 131b (the left part in FIGS. 20 and 22) of the outer frame 131 via a spacer 136. In FIG. 23, the elements affixed with the reference numerals 138 are bolts for fastening the spacer 136 onto the outer part 131b of the outer frame 131.

An inner frame 140 is located between these sliders 135 and 137. The inner frame 140 like the outer frame 131, is formed to have a channel-like shape, and guides 141 are fixed on the outer surfaces of the side walls. The guides 141 are fitted to the sliders 135 and 137 of the outer frame 131 such that the inner frame 140 can slide back and forth in the Y direction.

A pair of bearings 142 are provided on inner lower positions of the outer part 131b of the outer frame 131, and a ball screw serving as a Y direction rotary shaft 143 is rotatably supported by these bearings 142. Further, the shaft 143 is screwed into a nut 144 between the bearings 142 (see FIGS. 22 and 23). The nut 144 is fixed to a lower position of the side wall of the inner frame 140. One end rotary shaft 143 protrudes from the corresponding bearing 142, and a bevel gear 145 is fixed to the protruding end. Further, a bevel gear 146 is spline-connected to the adjusting shaft 128 to be rotatable integrally with the shaft 128 is rotated in the positive or negative direction while at the same time being movable relative to the shaft 128 in the axial direction. The bevel gear 146 is also meshed with the bevel gear 145 of the Y direction rotary shaft 143. Accordingly, when the Y direction adjusting shaft 128 is rotated in the positive or negative direction, the Y direction rotary shaft 143 is rotated corresponding direction via the bevel gears 146 and 145 to move the nut 144 in the Y direction together with the inner frame 140.

Figure 22:
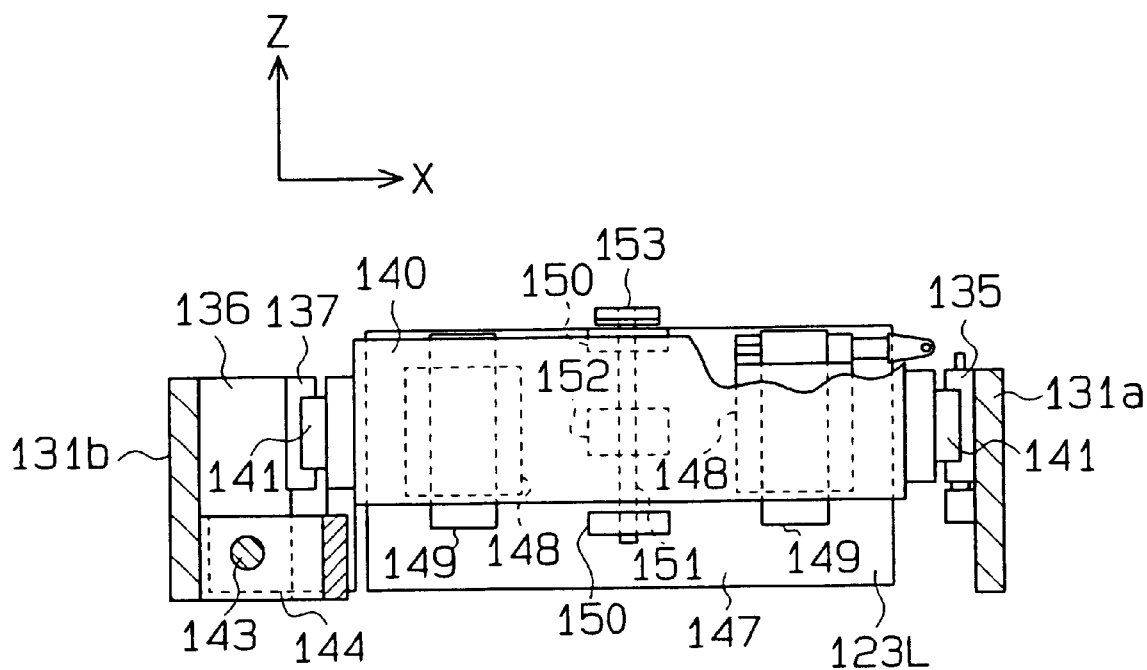
FIG. 22 is a side cross-sectional view showing the structure on which the CCD camera is supported.

As shown in FIGS. 20 and 22, a pair of sliders 148 are fixed on the inner wall surface of the center position of the inner frame 140 with a predetermined distance therebetween. A pair of guides 149 are fixed on the rear face of a box-like case 147 in which the CCD camera 123 is housed with a predetermined distance therebetween, and each of these guides 149 is fitted to the corresponding slider 148 to be slidable in the vertical direction (in the Z direction). A pair of bearings 150 are fixed on the rear face of the case 147 at a center upper position and at a center lower position, and a ball screw serving as a Z direction adjusting shaft 151 is supported by these bearings 150 to be rotatable in the positive and negative directions. A nut 152 is fixed on the inner wall surface of the center position of the inner frame 140 at a position where the Z direction adjusting shaft 151 is present, and the Z direction adjusting shaft 151 is screwed into this nut 152. An operating knob 153 is fixed to the upper end portion of the Z direction adjusting shaft 151, and the CCD camera 123L can be moved in the vertical direction (Z direction) by manually turning this operating knob 153 in the positive or negative direction.

Figure 24:
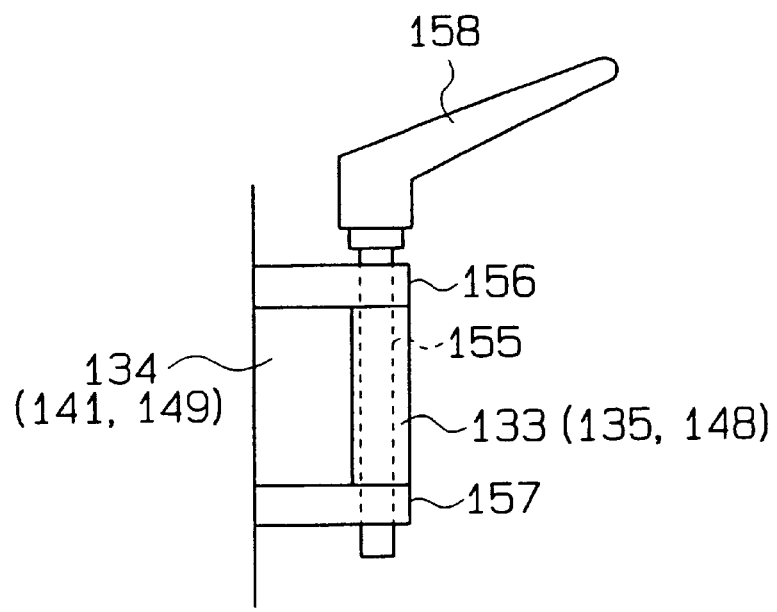
FIG. 24 is a side view showing clamping pieces for the CCD camera.

As shown in FIG. 24, tightening screws 155 are screwed into the sliders 133, 135 and 145. Each tightening screw 155 is screwed into a clamping piece 157 abutted against one side of the slider 133, 135 or 148, and another clamping piece 156, which is abutted against the other side of the slider 133, 135 or 148. An operating handle 158 is fixed to one end of each tightening screw 155. Accordingly, when the tightening screws 155 are turned in the tightening direction via the associated operating handle 158, the clamping pieces 156 and 157 grip both sides of the respective guide 134, 141 or 149 to disable relative movement of the slider 133, 135 or 148 and the guide 134, 141 or 149. Thus, the CCD camera 123L is immobilized after adjustment of its position in the X, Y and Z directions. Meanwhile, when the operating handle 158 is turned in the loosening direction, the clamping pieces 156 and 157 release the guide 134, 141 or 149 to permit relative movement of the slide 133, 135 or 148 and the guide 134, 141 or 149. Thus, the position of the CCD camera 123L can be adjusted and held in the X, Y and Z directions.

When the position of the CCD camera 123L is to be adjusted in the X direction, the camera 123L can be moved between the position depicted by the solid line to the position depicted by the two dash-dotted line in FIG. 11, i.e., from the leftward extremity in FIG. 11 to about the center of the table 13 of the table unit 12 with respect to the X direction. When the position of the CCD camera 123L is to be adjusted in the Y direction, under actuation of the Y axis drive motor 97, the camera 123L can be moved between the position depicted by the solid line to the position depicted by the two dash-dotted line in FIG. 11, i.e., from the bottom of FIG. 11 to about the center of the length of the table 13 with respect to the Y direction.

Referring to the CCD camera 123R, the arrangement of elements constituting the supporting structure is a mirror image of that for the CCD camera 123L. Accordingly, as shown in FIG. 11, the position of the camera 123R can be adjusted in the X direction between the position depicted by the solid line to the position depicted by the two dash-dotted line, i.e., from the rightward extremity of FIG. 11 to about the center of the width of the table 13 with respect to the X direction. In the Y direction, the camera 123R can be adjusted between the position depicted by the solid line to the position depicted by the two dash-dotted line, as shown in FIG. 11, i.e., from the lower extremity of FIG. 11 to about the center of the length of the table 13.

Next, the second printing position detecting unit 122 will be described.

Figure 9:
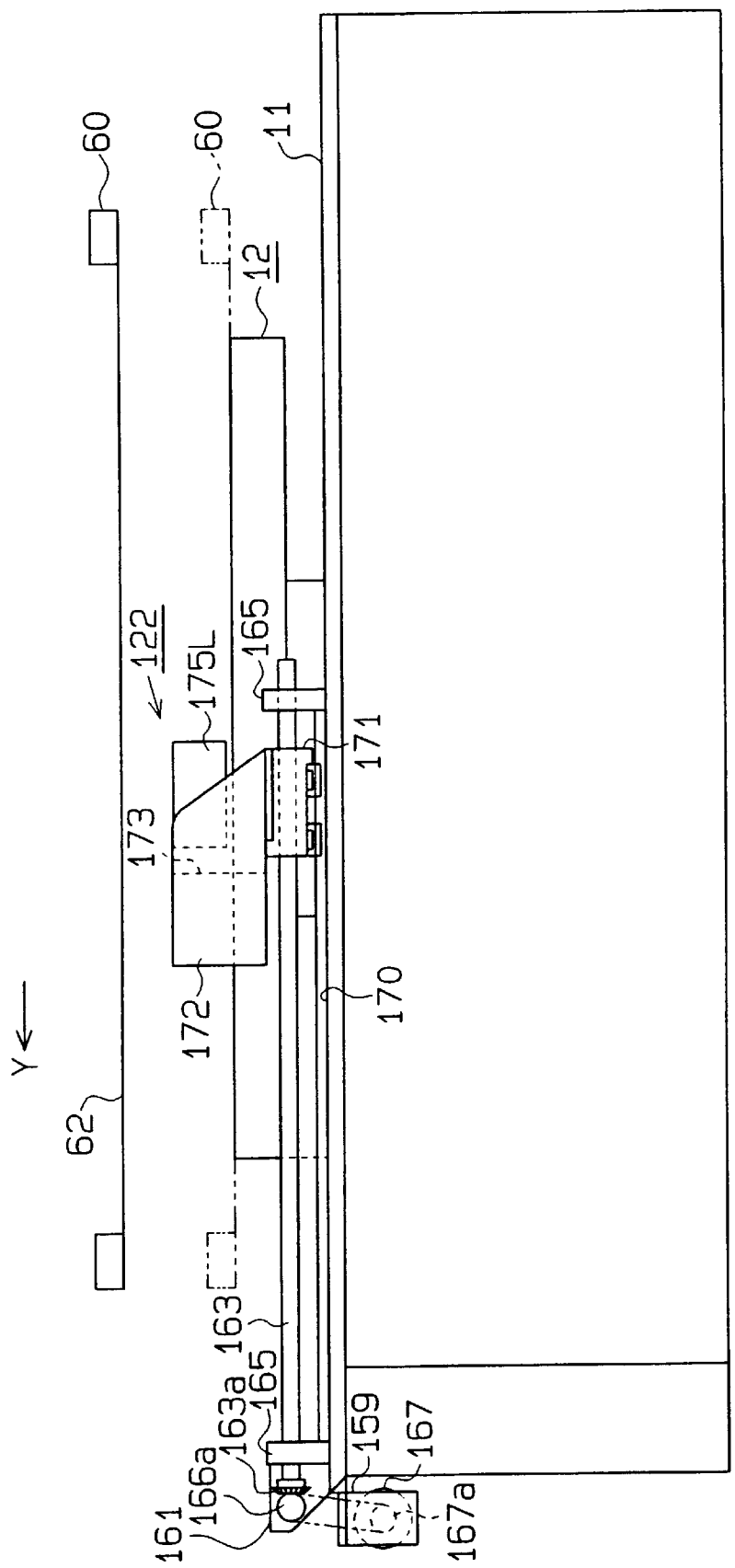
FIG. 9 is a side view of the pertinent portion of a second printing position detecting unit in the screen printing apparatus taken in the X direction.

FIG. 9 is a side view of a pertinent portion of the second printing position detecting unit 122 taken in the X direction.

As shown in FIGS. 9 and 11, a pair of ball screws 162 and 163 are rotatably supported by bearings 164 and 165, respectively, to extend along the main body 11 in the Y direction on each side of the table unit 12 and substantially over half the length of the main body 11 at positions outward of the pair of ball screws 92 and 93. Bevel bears 162a and 163a are fixed to the distal end portions of the ball screws 162 and 163 with respect to the Y direction, respectively.

A shaft 166 is rotatably supported on the main body 11 via bearings 161 to extend in the X direction between the bevel gears 162a,163a. The rotary shaft 166 has bevel gears 166a fixed to each end, which are meshed with the bevel gears 162a and 163a of the ball screws 162 and 163, respectively.

A Y axis drive motor 167, which is a step motor capable of revolving in the positive and negative directions, is located on the main body 11, and a pulley 167a (see FIG. 9) is fixed to its output shaft. A timing belt 169 is wrapped around the pulley 167a and another pulley 168 fixed at the middle of the rotary shaft 166 (see FIG. 11).

Accordingly, the rotary shaft 166 is driven by the revolution of the Y axis drive motor 167 via the timing belt 169, and the driving torque is transmitted via the bevel gears 166a, 162a and 163a to the ball screws 162 and 163. The Y axis drive motor 167 is provided with a rotary encoder so that its degree of rotation may be detected.

As shown in FIGS. 7 to 9, a pair of guide rails 170 are provided on the main body 11 and below the ball screws 162 and 163 to extend in the Y direction, respectively. Sliders 171 are slidably fitted to the guide rails 170 and are engaged with the ball screws 162 and 163. Accordingly, the sliders 171 can be moved back and forth in the Y direction with the rotation of the ball screws 162 and 163.

Side plates 172 stand on the sliders 171, and a transverse part 173 is extended across the side plates 172 (see FIG. 11).

A pair of CCD cameras 175R and 175L, each constituting a first and second alignment mark detecting means, are provided on the transverse part 173 on the distal side and on the proximal side with respect to the X direction. It should be noted here that since the supporting structure of the CCD camera 175L and that of the CCD camera 175R are the same as that of the CCD cameras 123R and 123L, description of it will be omitted.

The position of the cameras 175L and that of 175R can be adjusted in the X direction within the range depicted by the two dash-dotted lines, as shown in FIG. 11, while in the Y direction between the position depicted by the solid line to the position depicted by the two dash-dotted line, as shown in FIG. 11.

Figure 25:
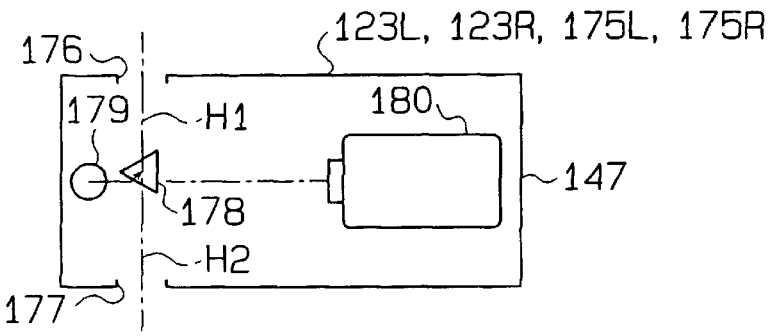
FIG. 25 is a schematic explanatory view of the CCD camera.

Further, as shown in FIG. 25, the cases 147 of the CCD cameras 123L, 123R, 175L and 175R each have a CCD sensor 180 as an image sensor, a first light path H1 for introducing incident light from a target (an alignment mark on the screen) located above the CCD camera 123L, 123R, 175L or 175R and a second light path H2 for introducing incident light from a target (an alignment mark on the substrate P in this embodiment) located below the CCD camera 123L, 123R, 175L or 175R. The case 147 has openings 176 and 177 the top and the bottom and a prism 178 rotatably held at the location where the light paths H1 and H2 intersected the axis of the CCD sensor 180. The reflecting position of the prism 178 is changed when it is turned by 90 degrees in the positive or negative direction by an actuator 179 such as a solenoid to select the first or second light path H1 or H2 and detect the target located above or below the CCD sensor 180. A lens (not shown) is located in each light path.

Control system

Figure 26:
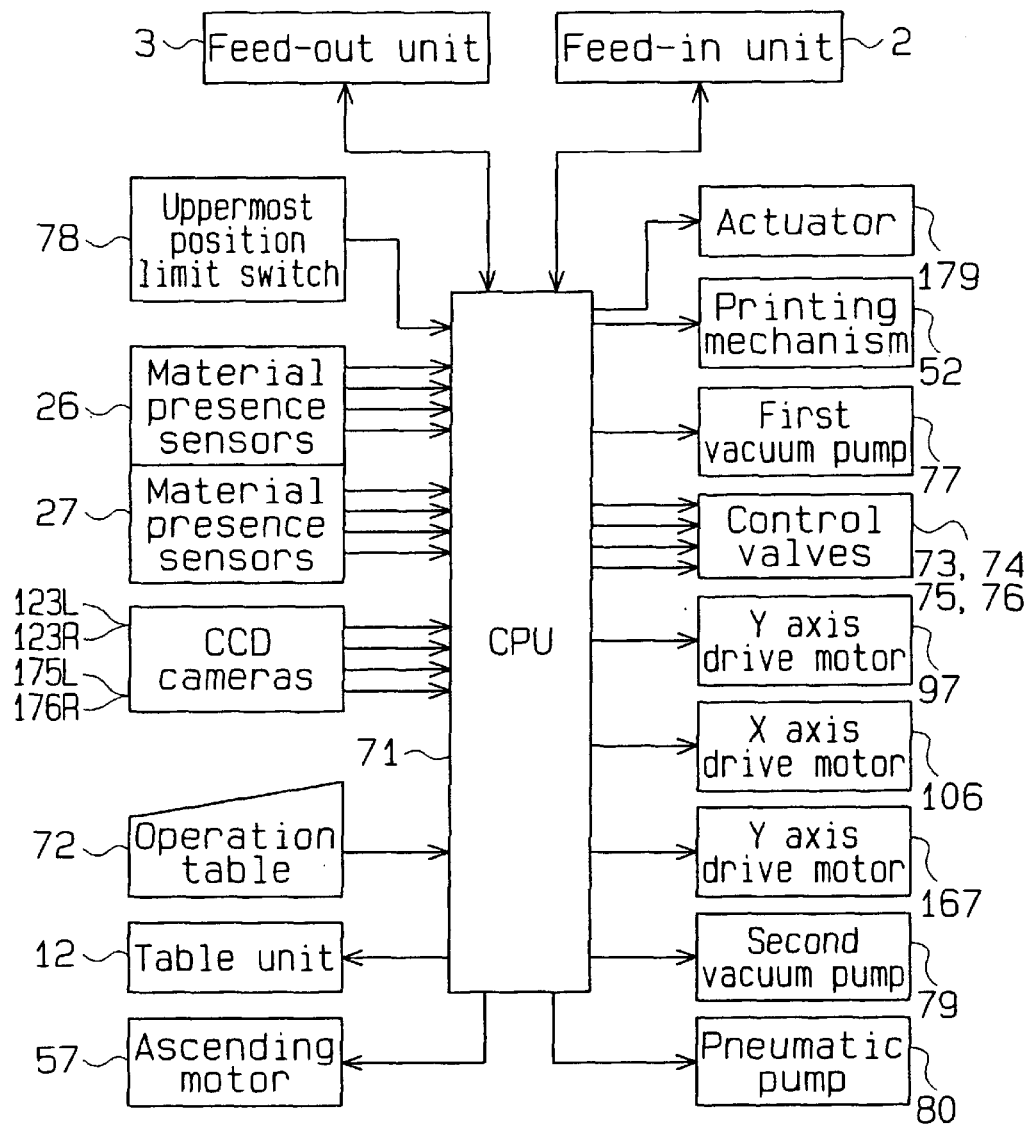
FIG. 26 is a block diagram showing a control system of the screen printing.

Next, a control system will be described referring to the diagram of FIG. 26.

A central processing unit (hereinafter referred to as CPU) 71 is provided with a control section, a ROM (not shown) for storing various control programs and a RAM (not shown) as a readable and writable memory for storing various input and output data and also operational data. Control means for movement of the screen, control means for the carrying means for the alignment mark detecting means and the relative position controlling means are connected to the CPU.

The material presence sensors 26 and 27 are electrically connected to the CPU 71 to input material presence or absence detection signals to the CPU 71. An operation table 72, or a means for setting lift pins, has input keys including numerical keys and is also electrically connected to the CPU 71. When data of a certain number relating to the lift pins 42 (entered by the input keys) is input to the CPU 71, the CPU 71 stores the data in a predetermined memory zone of the RAM.

Further, when data for specifying the positioning pins 32 and 33 to be used is set and input by the input keys on the operation table 72, the CPU 71 also stores that data in a predetermined memory zone of the RAM.

The operation table 72 also has input keys for manually operating the respective units in the screen printing apparatus 1, and the CPU 71 can control these units in the screen printing apparatus 1 based on control signals from these input keys.

The uppermost position limit switch 78 is electrically connected to the CPU 71 and inputs an "ON" signal to the CPU 71 when the printer frame 60 is located at the uppermost position.

The CCD sensors 180 in the CCD cameras 123L, 123R, 175L and 175R are electrically connected to the CPU 71, and the CPU 71 performs image recognition based on image signals from the respective sensors 180.

The drive motors for driving the table unit 12 with respect to the axis X, axis Y and angle theta (θ) are electrically connected to the CPU 71 and drive the table unit 12 with respect to the axis X, axis Y and angle theta (θ) based on drive control signals from the CPU 71, respectively. The rotary encoders (not shown) provided in the respective drive motors input detection signals to the CPU 71, and the CPU 71 calculates the amount of rotation the drive motors based on these signals.

The ascending/descending drive motors 57, which are driving sources for raising and lowering the stanchions 53 are electrically connected to the CPU 71 to raise and lower the stanchions 53 based on drive control signals from the CPU 71. The rotary encoder (not shown) provided in each ascending/descending drive motor 57 inputs a detection signal to the CPU 71, and the CPU 71 calculates the amount of rotation of the driving the motor 57 based on the signal.

Control valves 73 and 74 for the air cylinders 38 and 49 are provided in suction pipes connecting the suction chambers to a pneumatic pump 80, respectively. The control valves 73 and 74 are electrically connected to the CPU 71 and are switched and operated based on drive control signals from the CPU 71. When the control valves 73 and 74 are switched over to be connected to the pneumatic pump 80 based on the drive control signal from the CPU 71, they retain the rods 39 and 50 of the air cylinders 38 and 49 at the ascended position, descended position or stand-by position. The pneumatic pump 80 is also electrically connected to the CPU 71 to be driven based on drive control signals from the CPU 71.

Further, the first vacuum pump 77 and the second vacuum pump 79 are electrically connected to the CPU 71 to be driven based on drive control signals from the CPU 71, respectively. The printing mechanism 52 is also electrically connected to the CPU 71 to perform printing under control by the CPU 71 based on various printing control signals thereof.

Suction control valves 75 and 76 are provided in suction pipes connecting the first vacuum pump 77 and the suction chambers 23 and suction pipes connecting the second vacuum pump 79 and the through holes 41a and 42a of the lift pins 41 and 42, respectively. These control valves 75 and 76 are also electrically connected to the CPU 71 to be operated based on drive control signals from the CPU 71. Valve bodies (not shown) of the control valves 75 and 76 can be switched over to suction positions, where they are connected to the suction side of the vacuum pump 77, discharge positions, where they are connected to the discharge side of the vacuum pump 77, or to an intermediate position of these two. When the valve bodies assume the suction position, discharge position or intermediate position, suction or discharge through the suction chambers 23 and the through holes 41a and 42a of the lift pins 41 and 42 or cessation of these actions is performed, respectively.

Furthermore, the CPU 71 is also electrically connected to an electronic control unit (hereinafter referred to as "control section") for controlling the feed-in unit 2 and the feed-out unit 3.

The Y axis drive motor 97 and the X axis drive motor 106 of the film thickness detector 91 are electrically connected to the CPU 71 to be rotated in the positive and negative directions based on drive control signals from the CPU 71. The Y axis drive motor 167 of the second printing position detecting unit 122 is also electrically connected to the CPU 71 to be rotated in the positive and negative directions based on drive control signals from the CPU 71. The rotary encoders (not shown) provided in the respective drive motors 97, 106 and 167 input detection signals to the CPU 71, and the CPU 71 calculates the amount of rotation of each drive motor based on these signals.

The actuators 179 are also electrically connected to the CPU 71 to be turned by 90° in the positive and negative directions based on drive control signals from the CPU 71. Thus, the prisms 178 are also turned in the positive and negative directions, so that the CCD sensors 180 can select via the prisms 178 either the first light path H1 or the second light path H2.

Operation of the screen printing apparatus having the constitution as described above will now be described.

Figure 27:
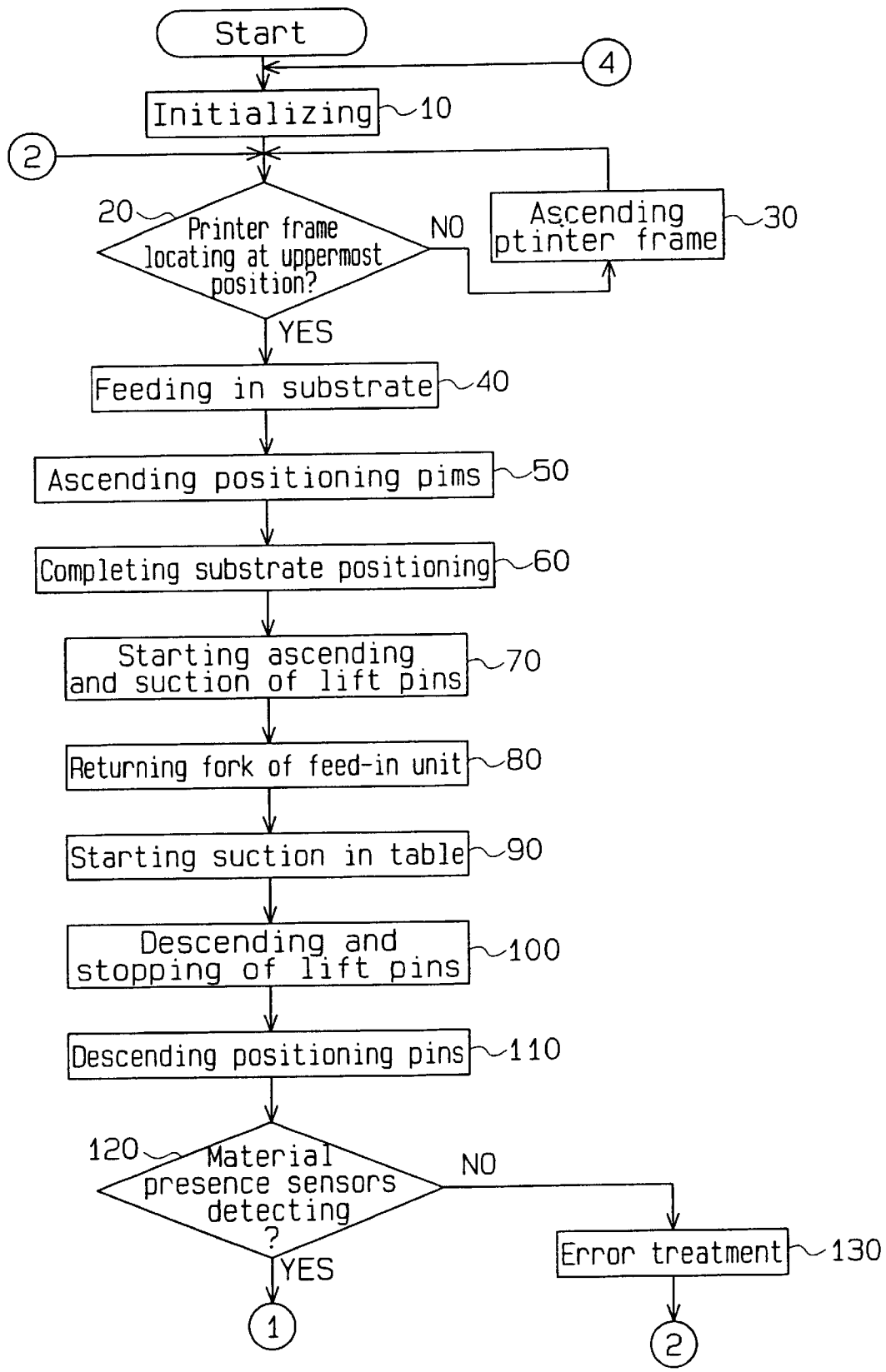
FIG. 27 is a flow chart showing a control routine during printing.
Figure 28:
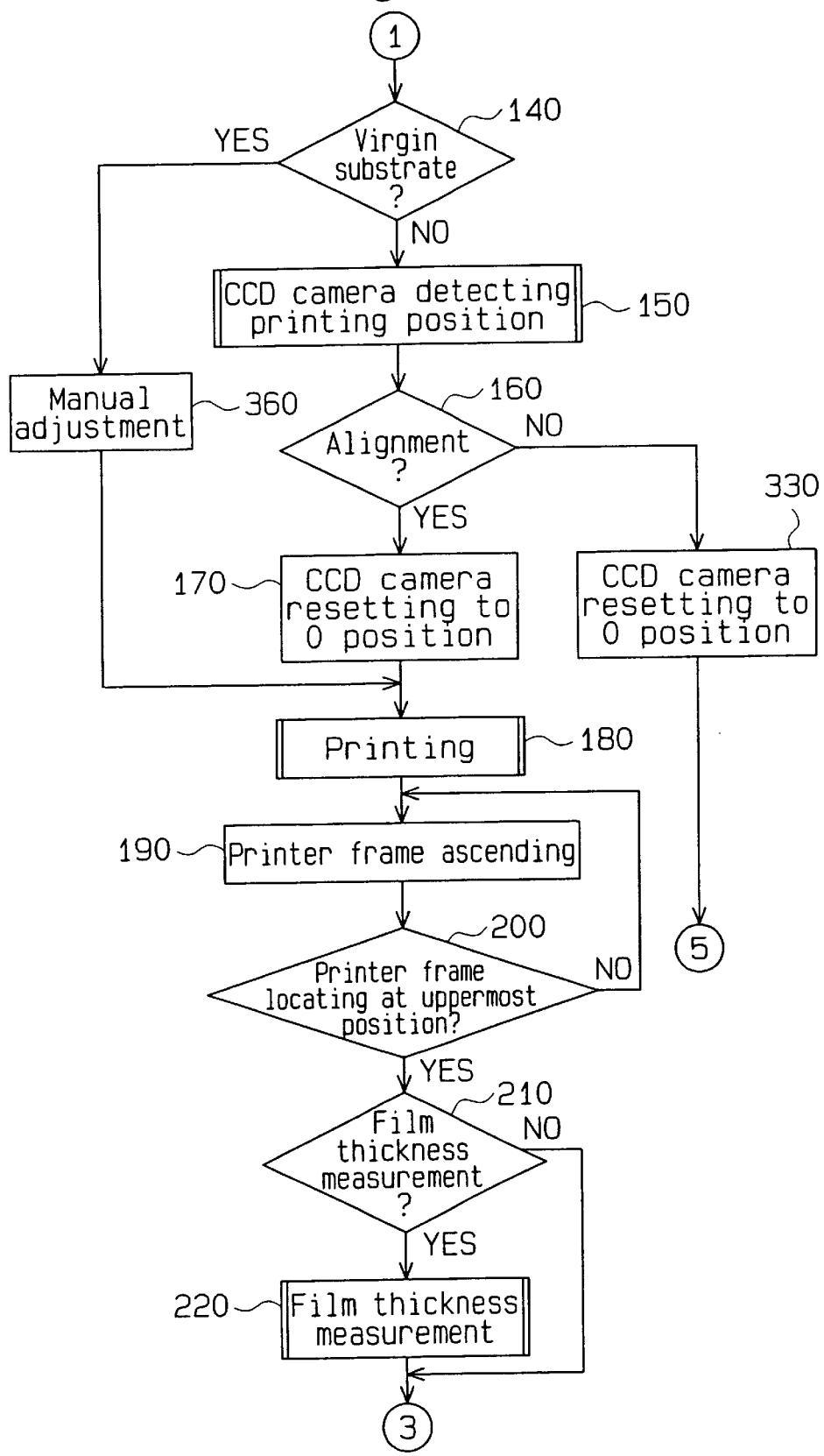
FIG. 28 is also a flow chart showing a control routine during printing.
Figure 29:
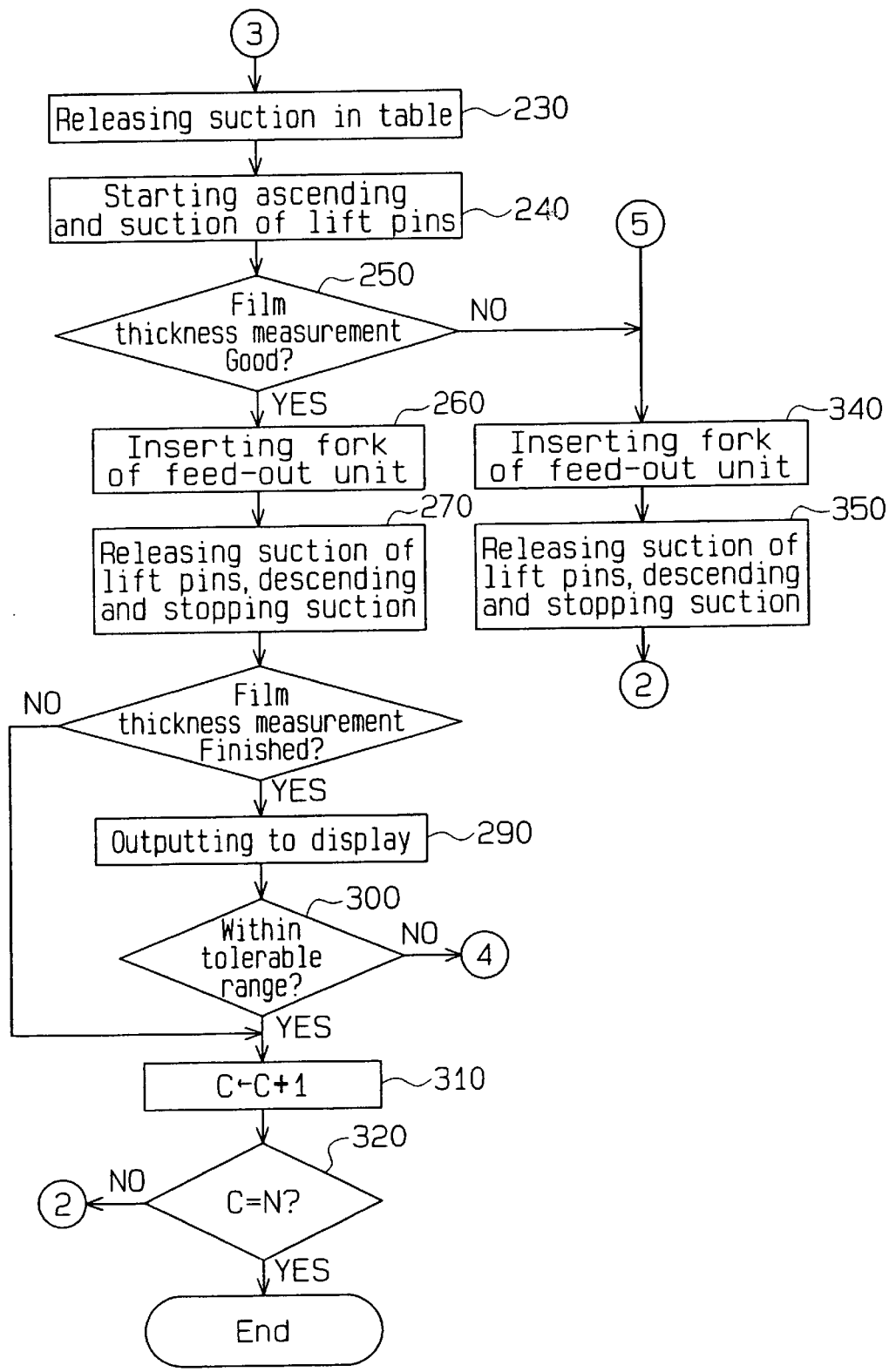
FIG. 29 is also a flow chart showing a control routine during printing.

FIGS. 27 and 28 are flow charts each showing a control routine of the table unit 12 under printing operation to be executed by the CPU 71.

This control routine can be roughly divided as follows:

Control of positioning a substrate P fed into the printing apparatus 1 by the feed-in unit 2 (steps 10 to 130);

Control of positioning the screen 62 and the substrate P relative to each other (steps 140 to 170, in which step 150 constitutes alignment mark detection, and step 160 constitutes printing position control means);

Printing routine (step 180, which constitutes printing control);

Processing for film thickness measurement (steps 190 to 220, in which steps 190 and 200 constitute screen retracting control);

Normal substrate feeding out (steps 230 to 270);

Printing renewal (steps 280 to 320); and

Abnormal substrate feeding out (steps 340 and 350, which constitute abnormal printed matter rejection).

Before the printing control routine, the printer frame 60 is located at the vicinal position above the table 13, and the positioning pins 32 and 33 and the lift pins 41 and 42 are located on the same plane with the mounting face 18a of the table 13, while no suction force is applied to the suction chambers 23 and the lift pins 41 and 42.

The CCD cameras 123L,123R and 175L,175R of the first and second printing position detecting units 121 and 122 are located, with respect to the Y direction, at the 0 positions outside the printer frame 60 as indicated by "01" and "02" in FIG. 11, respectively, so that they will not interfere with the printer frame 60 when located close to the face 18a of the table 13 of the table unit 12. With respect to the X direction, the positions of the CCD cameras 123L,123R and 175L, 175R are manually adjusted beforehand such that they can catch alignment marks on a substrate P to be mounted on the table unit 12 and are immobilized by the clamping pieces 156 and 157.

Control routine for positioning the substrate fed in by the feed-in unit 2

When this control routine operates, the operation table 72 inputs in step 10 various data necessary for driving the screen printing apparatus:

(1) Various data on driving the table unit 12 (including, for example, data for selecting lift pins 41 and 42 to be employed depending on the size of a substrates P to be printed, positioning pin selection data, etc.);

(2) Various data on driving the printing mechanism 52 (including, for example, data on the moving speed of the squeegee 65 and that of the doctor);

(3) Data on driving the first and second printing position detecting units 121 and 122 (including, for example, the distance of the alignment marks provided on the screen 61 from the zero positions "01" and "02" (initial value data Y0); the distance from the 0 positions of the CCD cameras 123L, 123R, 175L and 175R with respect to the X direction to the positions where they are manually adjusted and clamped (initial value data X0); deviation angles of the alignment marks provided on the screen 62 with respect to a base line passing the rotational center of the table unit 12 (initial value data theta (θ)0); and data for setting mark-to-mark distance of the alignment marks provided on the substrates P, etc.);

(4) Data on driving the film thickness detector 91 including, for example, direction of measurement (X or Y direction), data on the moving distance for film thickness measurement and data on measurement start position and measurement end position; and (5) Virgin substrate data to show whether or not a substrate P is a virgin substrate having no alignment marks, and these data are stored in the RAM.

After completion of inputting of these data, it is judged in step 20 whether or not the printer frame 60 is at the uppermost position. If no "ON" signal is input by the uppermost position limit switch 78, the process proceeds to step 30 where the ascending/descending drive motors 57 are actuated to ascend the ascending/descending mechanisms (not shown) and move the screen 62 away from the table 13.

When the printer frame 60 is at the uppermost position, that is when an "ON" signal is input by the uppermost position limit switch 78 for detecting the uppermost position, the process proceeds to step 40. In step 40, the feed-in unit 2 operates the fork 8 to pick up a substrate P from the rack 9 and brings the fork 8 loading the substrate P thereon above the table unit 12 (see FIG. 1). When a signal demanding positioning of the substrate is input by the feed-in unit 2 to the CPU 71 in this state, the CPU 71 reads, based on this signal, the positioning pin selection data stored in the RAM to output drive control signals to control valves 73 corresponding to the selected positioning pins 32 and 33 (hereinafter simply referred to as positioning pins 32 and 33) and drives the control valves 73. Thus, the positioning air cylinders 38 are operated by driving the control valves 73, and the positioning pins 32 and 33 are ascended via the rods 39 (see FIG. 16).

After the positioning pins 32 and 33 are completely ascended, the feed-in unit 2 moves the fork 8 against the X and Y directions indicated in FIG. 1 in step 60 to position the substrate P by bringing it in abutment with the lateral sides of the positioning pins 32 and 33. The process proceeds to step 70 where the lift pin selection data stored in the RAM is read, and drive control signals are output to the control valves 74 corresponding to the selected lift pins 41 and 42 (hereinafter simply referred to as lift pins 41 and 42) to drive the control valves 74. Thus, the air cylinders 49 are operated by driving the control valves 74 to ascend the lift pins 41 and 42 via the rods 50 (see FIG. 16). Further, in step 70, drive control signals are output to the control valves 76 to bring the valve bodies of the control valves 76 at the suction positions. Since the through holes 41*a* and 42*a* of the lift pins 41 and 42 are communicated to the second vacuum pump 79 by the operations described above, suction force is applied to the substrate P via the through holes 41*a* and 42*a*.

The thus positioned substrate P is transferred from the fork 8 to the lift pins 41 and 42 and is also lifted while being held on the upper ends of the lift pins 41 and 42, which are located at their uppermost position, under the suction force applied through the through holes 41*a* and 42*a* thereof.

In the subsequent step 80, the feed-in unit 2 retracts the fork 8 horizontally from the position above the table 13 to a stand-by posture, where the fork 8 is prepared to feed another substrate P to be printed from in the rack 9. Thus, the fork 8 of the feed-in unit 2 can be moved without interference with the substrate P lifted by the lift pins 41 and 42.

In step 90, control signals are output to the control valves 75 to switch the valve bodies of the control valves 75 to the suction positions. Since the suction chambers 23 of the table 13 are communicated to the first vacuum pump 77 by this operation, suction force is applied to the substrate P through the suction chambers 23.

In the subsequent step 100, control signals are output to the control valves 74 relating to the ascended lift pins 41 and 42 to drive the corresponding valves 74. Thus, the air cylinders 49 are operated to lower the lift pins 41 and 42 via the rods 50. After the lift pins are completely lowered, more specifically, when the lift pins are located on the same plane as the mounting face 18*a* of the table 13, control signals are output to the control valves 76 to locate the valve bodies thereof at the intermediate positions. Thus, application of the suction force to the substrate P through the through holes 41*a* and 42*a* of the lift pins 41 and 42 is stopped. However, since application of the suction force through the suction chambers 23 of the table 13 is continued, the substrate P having been held on the lift pins 41 and 42, is then mounted on the table 13 securely by the suction force applied thereto, so that the substrate P is prevented from slipping.

In the next step 110, the CPU 71 outputs control signals to the control valves 73 relating to the lifted positioning pins 32 and 33 to drive the corresponding valves 73. Thus, the positioning air cylinders 38 are operated by driving the control valves 73 to lower the positioning pins 32 and 33 via the rods 39.

Next, in step 120, it is judged whether or not "ON" signals showing presence of a material are input by the material presence sensors 26 and 27 starting from the sensors 26 and 27 located closest to the center of the table 13 to the sensors 26 and 27 corresponding to the positioning pins 32 and 33 described above. In the case where "ON" signals are not input by all of these corresponding material presence sensors 26 and 27, the CPU 71 judges that the substrate P is positioned incompletely and outputs a rejection signal to the control section of the feed-in unit 2, followed by error treatment in step 130. More specifically, the feed-in unit 2 rejects the erroneous substrate P based on the rejection signal, inputs a rejection completion signal to the CPU 71 and returns to step 20. The CPU 71, upon receipt of the rejection completion signal, resumes the process starting from step 20.

Incidentally, in step 120, "ON" signals showing presence of a material to be detected are input by all of the corresponding sensors, the process proceeds to step 140.

Control routine for positioning the screen 62 and the substrate P

In step 140, it is judged whether the substrate P fed in is a virgin substrate or not based on the virgin substrate data input beforehand in step 10. If the substrate P is not a virgin substrate, the process proceeds to step 150, and if it is a virgin substrate, the process proceeds to step 360.

In step 360, since the virgin substrate P fed in has no alignment mark printed thereon, an operator manually performs alignment of the substrate P with the screen 62 of the printing mechanism 52 by operating the input keys of the operation table 72 while the operator confirms the alignment visually. After completion of this adjustment, when an operation completion signal is input to the CPU 71 by operating the keys of the operation table 72, the process proceeds to printing in step 180.

Meanwhile, in step 140, when the substrate P fed in is not a virgin substrate, the process proceeds to step 150 in which control of detecting printing position by the CCD cameras is performed.

Figure 30:
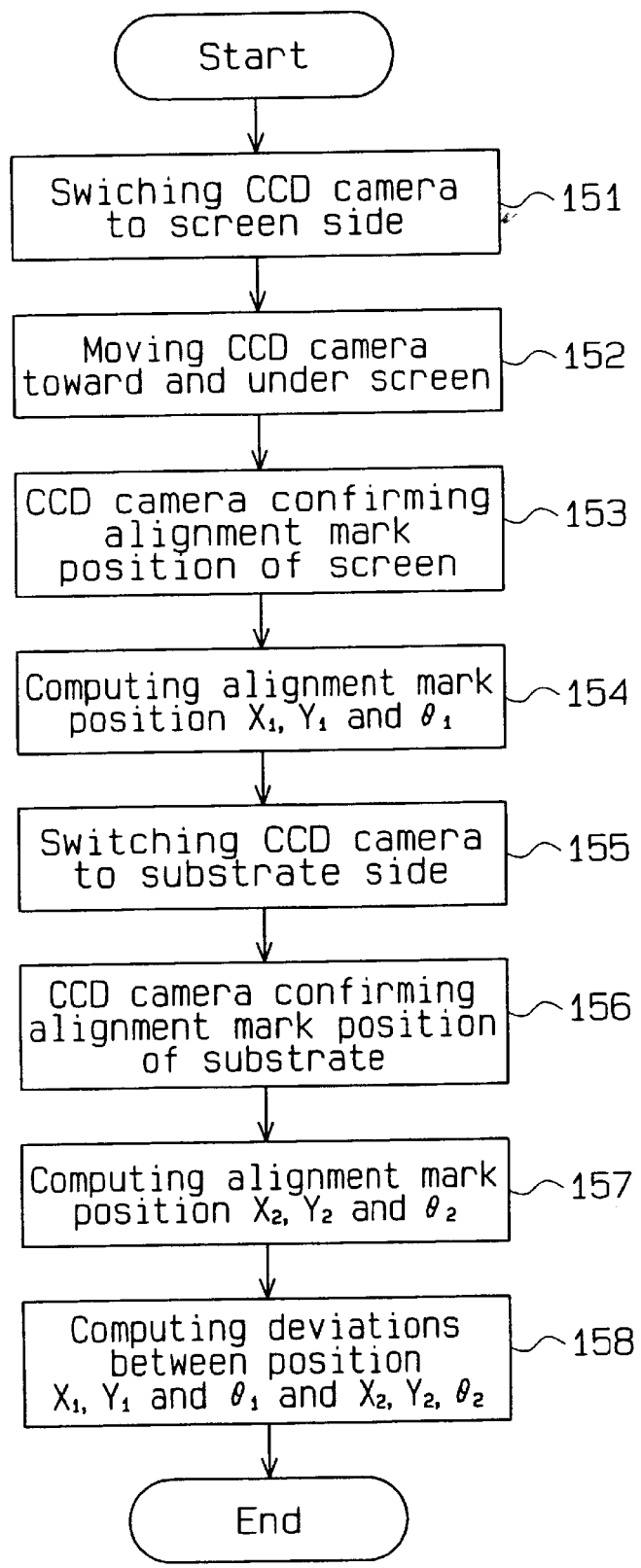
FIG. 30 is a flow chart showing an alignment control routine.

The routine of controlling detection of printing position by the CCD cameras will be described here referring to FIG. 30.

When this control routine is performed, the CPU 71 outputs rotational drive signals to the respective actuators 179 of the CCD cameras 123L, 123R, 175L and 175R to drive the actuators 179 in step 151. When each actuator 179 is driven, the prism 178 is turned to select the first light path H1 as an incident light path. Thus, the CCD cameras 123L, 123R, 175L and 175R are able to catch the image of the screen 62 located above them.

Figure 3:
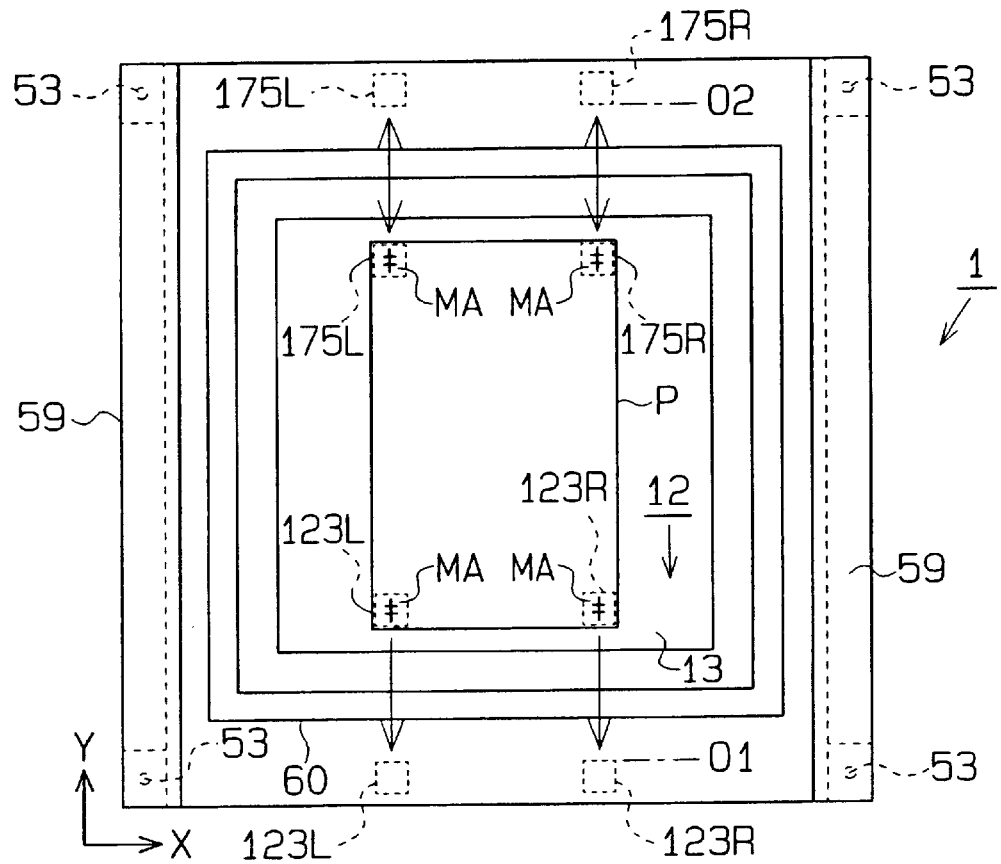
FIG. 3 is a plan view for illustrating movement of CCD cameras in the X and Y directions in the screen printing apparatus.
Figure 4:
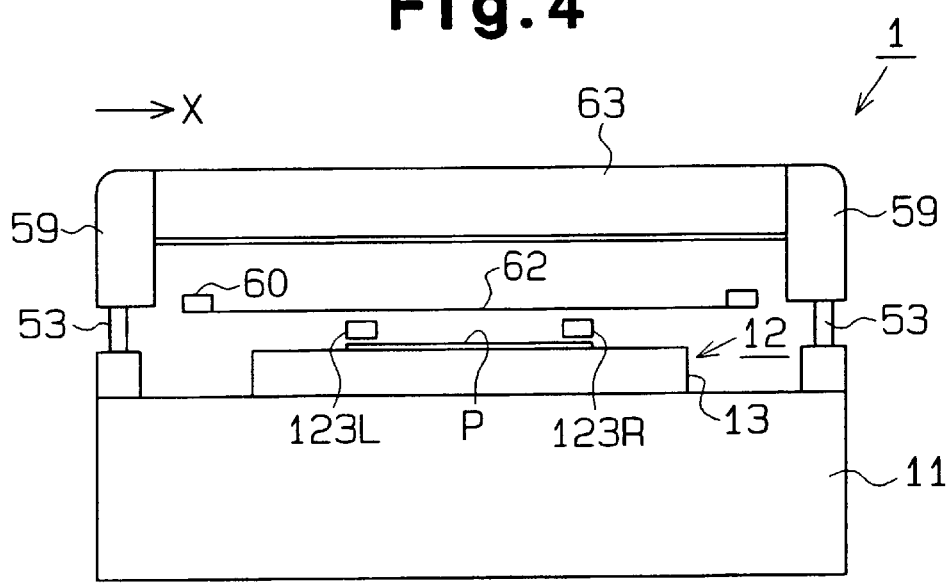
FIG. 4 is a side view for illustrating the movement of the CCD cameras in the X direction in the screen printing apparatus.

In the next step 152, the CPU 71 outputs drive control signals to the Y axis drive motors 97 and 167 based on the data (initial value data Y0) on the distance of each alignment mark on the screen 62 from the 0 position "01" or "02" to move the CCD cameras 123L, 123R, 175L and 175R from the 0 positions "01" and "02" shown in FIG. 3 to beneath the alignment marks of the screen 62, respectively (see FIG. 9).

This embodiment employs the corner reference where alignment marks are formed in the corners of the substrate P. As shown in FIG. 3, an alignment mark "MA" is formed in each of the four corners. Alignment marks (not shown) are also formed on the screen 62 at positions corresponding to the locations of the alignment marks "MA" of the substrate P.

In the next step 153, the CCD cameras 123L, 123R, 175L and 175R catch images of the alignment marks provided on the screen 62 to input the image data to the CPU 71.

In step 154, the CPU 71 computes X direction position data (X1), distance (Y1) of each alignment mark on the screen 62 from the 0 position "01" or "02" and an angle of deviation (theta ($\theta$)1) from the base line passing the rotation axis of the table unit 12 based on the thus input image data, the initial value data (X0), (Y0), (theta ($\theta$)0) and the detection signals output from the rotary encoders (not shown) of the Y axis drive motors 97 and 167 when the CCD cameras 123L, 123R, 175L and 175R are moved, and the CPU 71 stores the computed values (X1), (Y1) and (theta ($\theta$)1) in the RAM.

Subsequently, in step 155, the CPU 71 outputs rotational drive signals to the actuators 179 of the CCD cameras 123L, 123R, 175L and 175R to drive the actuators 179 in the opposite direction. Thus, each prism 178 is turned in the opposite direction to select the second light path H2 as an incident light path, and the CCD cameras 123L, 123R, 175L and 175R each catch an image of the substrate P below them.

In step 156, the CCD cameras 123L, 123R, 175L and 175R catch images of the alignment marks provided on the substrate P to input the image data to the CPU 71. In step 157, the CPU 71 computes X direction position data (X2), distance (Y2) of each alignment mark on the substrate P from the 0 position "01" or "02" and an angle of deviation (theta ($\theta$)2) from the base line passing the rotation axis of the table unit 12 based on the thus input image data. The computed values (X2), (Y2) and (theta ($\theta$)2) are stored in the RAM.

In the next step 158, the CPU 71 computes deviations (delta ($\Delta$)X), (delta ($\Delta$)Y) and (delta ($\Delta$) theta ($\theta$)) between the computed values (X1), (Y1) and (theta ($\theta$)1) obtained in step 154 and the computed values (X2), (Y2) and (theta ($\theta$)2) obtained in step 157, respectively. The deviation values are stored in the RAM.

The routine of controlling detection of the printing position is completed after the process of step 158, and the process proceeds to step 160.

Referring to the flow chart shown in FIG. 28, in step 160, the CPU 71 actuates the drive motors for driving the table unit 12 in the X and Y and theta ($\theta$) directions based on the thus computed deviation values (delta ($\Delta$)X), (delta ($\Delta$)Y) and (delta ($\Delta$) theta ($\theta$)) to move the substrate P relative to the screen 62 so as to compensate for these deviation values. If the deviations between the alignment marks "MA" of the substrate P and the alignment marks of the screen 61 are great, and the deviations between them cannot be compensated for even after completion of the relative movement of the substrate P and the screen 62, in other words, if it is judged that the substrate P is not positioned properly, the process proceeds to step 330.

In step 330, the CPU 71 outputs control signals to the Y axis drive motors 97 and 167 to actuate them and resets the CCD cameras 123L, 123R, 175L and 175R to the 0 positions "01" and "02", respectively.

Abnormal substrate rejecting routine

In the subsequent step 340, the feed-out unit 3 inserts the fork 8 between the substrate P lifted by the lift pins 41 and 42 and the table 13 to input a fork insertion completion signal to the CPU 71.

Next, in step 350, the CPU 71 outputs drive control signals to the control valves 76 of the raised lift pins 41 and 42 according to the fork insertion completion signal to switch the valve bodies of the corresponding control valves 76 to the intermediate positions. Thus, the suction force applied to the substrate P through the through holes 41a and 42a of the lift pins 41 and 42 is stopped. Further, the CPU 71 outputs drive control signals to the control valves 74 to drive them 74. When the control valves 74 are driven, the air cylinders 49 are operated to lower the lift pins 41 and 42 via the rods 50, and the movement of the lift pins 41 and 42 is completed when the upper ends thereof are located on the same plane as the mounting face 18a of the table 13. Meanwhile, the feed-out unit 3 raises the fork 8 to load the substrate P on the fork 8 and carry out the substrate P. After the rejected substrate P is carried out, the control section of the feed-out unit 3 inputs a carry-out completion signal to the CPU 71.

Since the distance by which the raised lift pins 41 and 42 protrude from the mounting face 18a of the table 13 is designed to be greater than the thickness (vertical dimension) of the fork 8, the fork 8 does not interfere with the substrate 8.

After completion of step 350, the process returns to step 20.

In step 160, if the substrate P is positioned within a predetermined tolerable range to achieve compensation for the deviation, or if it is judged that the substrate P is positioned properly, the process proceeds to step 170.

In step 170, the CPU 71 outputs control signals to the Y axis drive motors 97 and 167, like in step 330, to actuate them and reset the CCD cameras 123L, 123R, 175L and 175R to the 0 positions "01" and "02", respectively.

Printing routine

When the process proceeds from step 360 or 170 to step 180, the CPU 71 controls the printing process by, for example, moving the squeegee 65. Since the control of this printing process is not the essential part of the present invention, a description of it will be omitted.

Processing routine for film thickness measurement

Before this control routine is performed, the substrate P is printed, and the printer frame 60 is located at the vicinal position above the table 13, while the positioning pins 32 and 33 and the lift pins 41 and 42 are flush with the mounting face 18a of the table 13, and suction is applied to the suction chambers 23.

When this control routine begins, the ascending/descending mechanism is operated under driving of a motor (not shown) to move the screen 62 farther from the table 13, and it is judged whether or not the printer frame 60 is at the uppermost position in step 200.

When the printer frame 60 is located at the uppermost position, i.e., when an "ON" signal is output from the uppermost position limit switch 78 for detecting the uppermost position, the process proceeds to step 210. In step 210, it is judged whether or not the film thickness should be measured based on a film thickness measurement judgment flag. When the film thickness is to be measured, the flag is set to "1" in step 10. Accordingly, it is judged whether this flag is set to "1" or not. If the flag is not set to "1", the process jumps to step 230.

When this flag is set to "1", the film thickness measurement control routine is executed in step 220.

Figure 31:
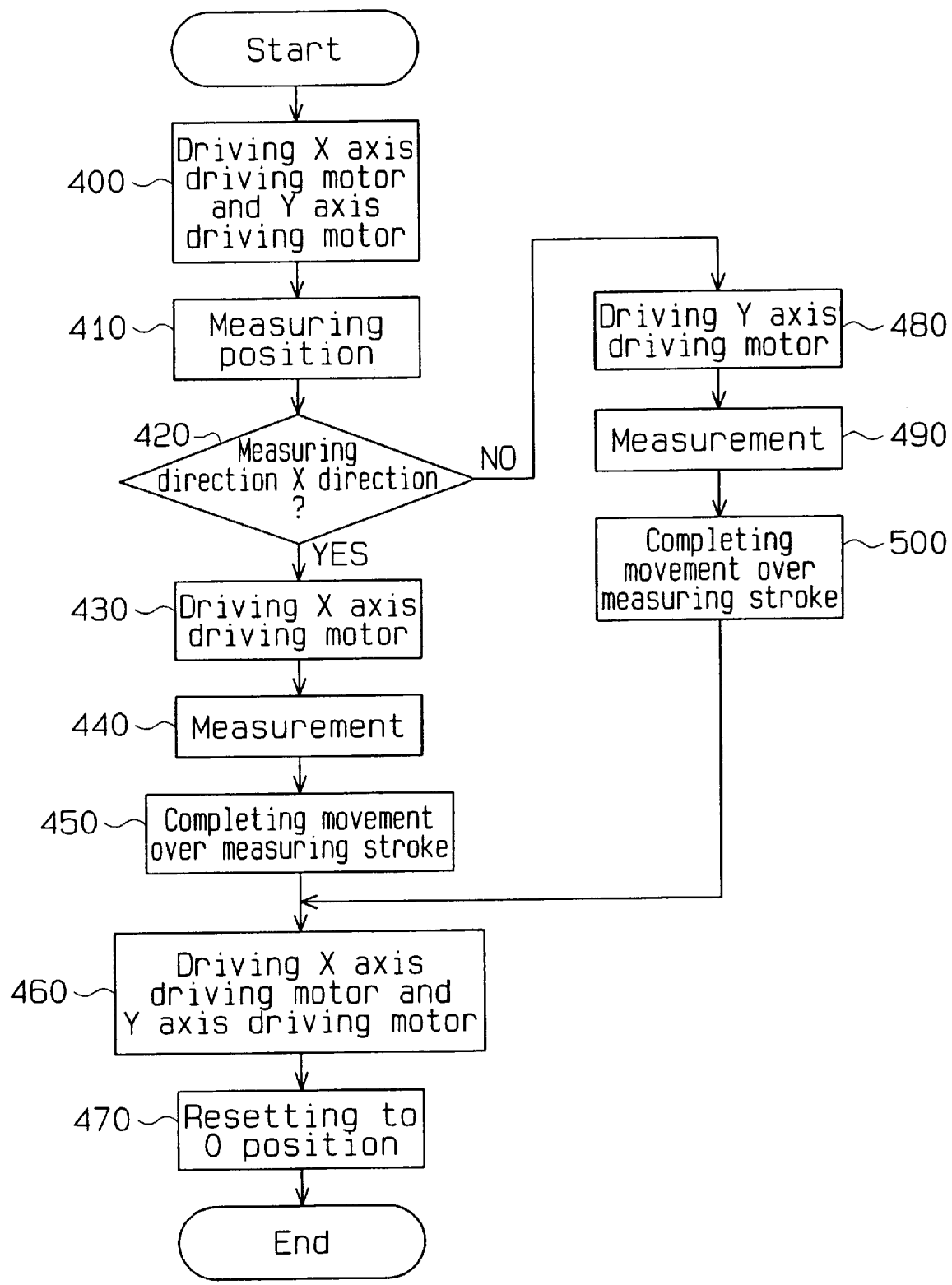
FIG. 31 is a flow chart showing a film thickness measurement control routine.

Next, the film thickness measurement control routine will be described referring to FIG. 31.

In step 400, drive control signals are output to the X axis drive motor 106 and Y axis drive motor 97 of the film thickness detector 91 based on the measurement start position data input beforehand in step 10. Thus, the transverse part 103 is moved in the Y direction, and the film thickness sensor 111 is moved to the measurement starting position (step 410).

Next, in step 420, it is judged whether the film thickness of the substrate P should be measured in the X direction or Y direction. This judgment is achieved based on the measurement direction data input and preset in step 10. When the measurement is preset to be carried out in the Y or X direction, the process proceeds to step 480 or 430, respectively.

In step 430, the X axis drive motor 106 is actuated to move the film thickness sensor 111 in the X direction. For example, when the film thickness sensor 111 is at the position shown in FIGS. 5 and 6, it is moved along the two dot-dashed lines indicated in these Figures. In step 440, the film thickness sensor 111 measures the thickness of the film formed on the substrate P during movement in the X direction and inputs the measurement data to the CPU 71. The CPU 71 stops the X axis drive motor 106 when the sensor 111 reaches the measurement end position (step 450), and the process proceeds to step 460.

Meanwhile, when the process proceeds from step 420 to step 480, the film thickness sensor 111 is moved in the Y direction by actuating the Y axis drive motor 97 in step 480. In step 490, the film thickness sensor 111 measures the thickness of the film formed on the substrate P during movement in the Y direction and inputs the measurement data to the CPU 71. The CPU 71 stops the Y axis drive motor 97 when the sensor 111 reaches the measurement end position (step 500), and the process proceeds to step 460.

When the process proceeds from step 450 or 500 to step 460, drive control signals are output to the X axis drive motor 106 and the Y axis drive motor 97 so as to reset the film thickness sensor 111 to the 0 position. Thus, the transverse part 103 is moved to the 0 position in the Y direction, and the film thickness sensor 111 is also moved to the 0 position in the X direction (step 470). When the process of step 470 is finished, this control routine is completed, and the process proceeds to step 230.

Steps 400 and 410 are control steps for shifting the measurement starting position, and step 420 is a step for judging measurement direction. Step 430 constitute control means for movement in the X direction, and step 480 is control step for movement in the Y direction. Meanwhile, the control of movement in the X direction and the control movement in the Y direction serves as a control process for movement in a predetermined direction. Steps 460 and 470 constitute control steps for resetting the motors to the 0 position.

Normal substrate feeding out routine

When the process proceeds from step 210 or 220 to step 230, the CPU 71 outputs drive control signals to the control valves 75 to switch the valve bodies of the corresponding control valves 75 to the discharge positions. Thus, air is discharged through the suction holes and the suction chambers 23 of the table 13 to release the suction force applied to the substrate P from the table 13.

In the subsequent step 240, lift pin selection data stored in the RAM is read to output drive control signals to the control valves 74 corresponding to the selected lift pins 41 and 42 (hereinafter simply referred to as lift pins 41 and 42), and the control valves 74 are driven. When the control valves 74 are driven, the air cylinders 49 are operated to raise the lift pins 41 and 42 via the rods 50 (see FIG. 16). Further, in step 240, control signals are output to the control valves 76 to move the valve bodies of the control valves 76 to the suction positions. Since the through holes 41a and 42a of the lift pins 41 and 42 are allowed to communicate with the second vacuum pump 79 by this operation, suction force is applied to the substrate P through these through holes 41a and 42a. As a result, the substrate P is raised while being held on the upper ends of the lift pins 41 and 42 under the suction force applied through the through holes 41a and 42a.

Next, in step 250, it is judged whether or not the film thickness measured in step 220 is within a tolerable range, and if such is the case, the process proceeds to step 260, and if not, the process proceeds to the abnormal substrate rejecting routine of steps 340 and 350 to carry out the substrate P.

When the process proceeds to step 260, the feed-out unit 3 inserts the fork 8 between the substrate P lifted by the lift pins 41 and 42 and the table 13, and then the control section inputs a fork insertion completion signal to the CPU 71 in step 260.

In the subsequent step 270, the CPU 71 outputs drive control signals to the control valves 76 corresponding to the ascended lift pins 41 and 42 to switch the valve bodies of the control valves 76 to the intermediate positions according to the fork insertion completion signals. Thus, the suction force applied to the substrate P through the through holes 41a and 42a of the lift pins 41 and 42 is stopped.

Then, the CPU 71 outputs drive control signals to the control valves 74 to drive them. When the control valves 74 are driven, the air cylinders 49 are operated to lower the lift pins 41 and 42 via the rods 50, and the descending movement of the lift pins 41 and 42 is completed when the upper ends thereof are located on the same plane as the mounting face 18a of the table 13. Meanwhile, the control section of the feed-out unit 3 raises the fork 8 to load the substrate P on the fork 8 and then carries out the substrate P. After the substrate P is carried out, the control section of the feed-out unit 3 inputs a carry-out completion signal to the CPU 71.

Incidentally, since the projecting distance of the lift pins 41 and 42 from the mounting face 18a of the table 13 is designed to be greater than the thickness (vertical dimension) of the fork 8, the fork 8 does not interfere with the substrate P.

In the subsequent step 280, it is judged whether measurement of film thickness is carried out or not. This judgment is made based on the film thickness measurement judgment flag described above. When the flag is set to "1", the process proceeds to step 290, and if not, it jumps to step 310.

In step 290, the film thickness measurement result is output to a display (not shown), and if the measured value is within a tolerable range, the process proceeds to step 310, and if not, the process returns to step 10 to carry out initialization. In other words, the process returns to step 10 to input the initial value data again.

When the process proceeds from step 280 or 300 to step 310, the substrate printing count "C" is incremented by "1"

in step 310, and it is judged in step 320 whether or not the substrate printing count "C" has reached a predetermined number N. This predetermined number N is input in step 10 and stored beforehand as an initial value data in the RAM. If the count "C" is smaller than the predetermined number N, the process returns to step 20 to resume preparation for printing another substrate P. When the count "C" has reached the predetermined number N, the printing control routine is completed.

The screen printing apparatus according to the present invention exhibits the following effects.

1) The film thickness sensor 111 and the CCD cameras 123L, 123R are located on the near side and on the for side of the transverse part 103 with respect to the origin of the Y axis. Thus, even if the moving zone of the film thickness sensor 111 for measuring film thickness in the X direction overlaps with the moving zones of the CCD cameras 123L, 123R for detecting alignment marks in the X direction, the sensor 111 and the cameras 123L, 123R are moved independently. Accordingly, the film thickness sensor 111 and the CCD cameras 123L, 123R can be moved in the X direction without interference.

2) In the state where the screen 62 is located at the upward position, the first printing position detecting unit 121 and the second printing position detecting unit 122 are moved into the space between the screen 62 and the table 13 so that they may detect the alignment marks "MA" provided on the substrate P and those provided on the screen 62. Accordingly, the alignment marks of the screen 62 are detected from the lower side of the screen 62, while the alignment marks of the substrate P are detected from the upper side of the substrate P.

As a result, the alignment marks "MA" of the screen 62 and of the substrate P can be detected directly and accurately at close positions, and the position of the table unit 12 is also adjusted based on the detection data, so that the alignment of the substrate P with the screen 62 can be made properly. Particularly, the alignment marks "MA" of the substrate P can be detected without intervention of the screen 62, and the alignment marks "MA" can be detected more clearly.

More specifically, the CCD cameras 123L, 123R, 175L and 175R can be moved closer to of the substrate P as needed for accuracy.

In the conventional apparatus, in which the alignment marks must be detected through and from the upper side of the screen, other parts or elements supporting the screen become obstacles requiring detection of the alignment marks at positions relatively far from the substrate. However, this drawback is eliminated in the apparatus and method of the present invention.

3) Each time a substrate P to be printed is fed in, alignment marks "MA" on the screen 62 and those on the substrate P are designed to be detected by the CCD cameras 123L, 123R, 175L and 175R to achieve alignment of the substrate P with the screen 62 (the procedures in steps 140 to 170).

As a result, if the screen 62 is slackened during printing, positioning and alignment of the substrate P with the screen 62 can be achieved according to the degree of slackness.

4) A pair of CCD cameras are provided in each of the first printing position detecting unit 121 and in the second printing position detecting unit 122 to be movable in the X and Y directions.

Accordingly, these four CCD cameras can readily cope with various arrangements of alignment marks provided on the substrate P or the screen 62, for example, where alignment marks are provided in four corners of the substrate P or only in two corners on a half of the substrate P.

5) The CCD cameras each consist of a single CCD sensor 180 and a rotatable prism 178 so that they can detect any alignment mark "MA" on the screen 62 or the substrate P by turning the prisms 178 to select the desired incident light paths to the CCD sensors 180.

Accordingly, a single CCD sensor 180 can detect alignment marks located on the opposite sides of (above and below) the sensor 180, so that the construction of the apparatus can be simplified and the number of parts can be reduced, leading to reduction in the cost.

Figure 6:
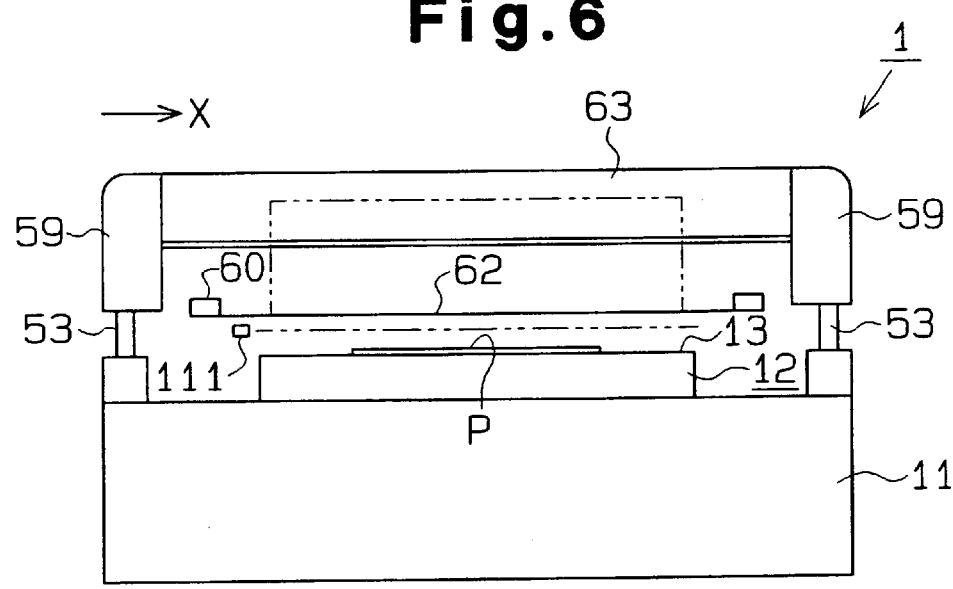
FIG. 6 is a side view for illustrating the movement of the film thickness detector in the X direction in the screen printing apparatus.

6) After completion of printing in step 180, the printer frame 60 or the screen 62 is raised, and the film thickness detector 91 (film thickness sensor 111) is introduced into the space between the table 13 and the screen 62, as shown in FIG. 6, so that the thickness of the coating film formed on the substrate P may be detected (the procedures in steps 190 and 200).

Accordingly, immediately after printing, the thickness of the coating film can be measured.

If the result of the film thickness measurement is not within the tolerable range, the process is returned to step 10 from step 300. Accordingly, before starting the subsequent printing step, the data initial value data can be changed instantaneously.

As described above, since the detection of film thickness is carried out immediately after printing, the film detection result can be reflected speedily to the next printing run.

7) The Y axis drive motor, which is a driving source for moving the first printing position detecting unit 121 in the Y direction, is allowed to serve also as a driving source for moving the film thickness sensor 111 in the Y direction.

Accordingly, no extra Y axis drive motor is needed for driving the film thickness detector 91, and the cost is reduced. That is, the zone where the CCD cameras 123L and 123R of the first printing position detecting unit 121 move in the Y direction overlaps with the zone where the film thickness sensor 111 moves in the Y direction for measuring film thickness, so that a single driving source can drive both of them.

Further, since the time that the CCD cameras perform detection and the time that the film thickness detector performs measurement differ from each other, there is no problem in carrying out detection and measurements even if they are operated by the single drive motor.

8) In step 80, the feed-in unit 2 retracts the fork 8 located above the table 13 horizontally to be ready to feed in the next substrate P stored in the rack 9. This horizontal retraction of the fork 8 permits the fork 8 to move without interference with the substrate P lifted up by the lift pins 41 and 42.

9) The lift pins 41 and 42 are arranged such that imaginary lines drawn to connect them form rectangles M1 and M2, respectively, and that the sides in the X direction of the rectangle M1 are longer than the sides in the X direction of the rectangle M2; whereas the sides in the Y direction of the rectangle M1 are shorter than the sides in the Y direction of the rectangle M2. Further, the lift pins 41 and 42 are arranged symmetrically with respect to the center line m, as shown in FIG. 14. With this arrangement, various sizes of substrates P can be mounted on the lift pins 41 and 42 by suitably selecting them.

10) The positioning pins 32 are arranged for each material presence sensor 27 to be symmetrical with respect to the center line m (see FIG. 14) such that the upstream sides of the positioning pins 32 tangentially meet with lines alpha (α)1 to alpha (α)4, which intersect at right angles with the imaginary lines connecting the light paths of the material presence sensors 27, as shown in FIG. 14. Further, two positioning pins 33 are tangentially aligned with the first two material presence sensors 26 (from the printing start side) and are located on the downstream side with respect to the center line n. Each pin 33 is a predetermined distance from the line n. The first two positioning pins 32 counted from the center line n and from the printing start side are tangentially aligned with the other two material presence sensors 26. As shown in FIG. 14, these positioning pins 32 and 33 are arranged at positions such that their sides that face the printing end tangentially meet with lines beta (β)1 to beta (β)4, which intersect at right angles with lines connecting the light paths of the material presence sensors 26.

As a result, even when substrates P1 and substrates P2 having different sizes are to be printed, as shown in FIG. 14, the substrates can be positioned with respect to the table 13 and can be printed regardless of the size thereof by selecting the appropriate positioning pins.

11) The through holes for retaining the substrate P under the suction provided in the lift pins 41 and 42 and in the table 13 securely retain the substrate P on the table 13 and on the lift pins 41 and 42 when the substrate is fed in and out and also ensure transference of the substrate P between the lift pins 41 and 42 and the table 13.

12) Since the positioning pins 32 and 33 are able to protrude from and retract into the mounting face 18a, the substrate P fed in from the upstream side can be securely positioned by extending the positioning pins 32 and 33.

When the substrate P is fed out, the fork 8 of the feed-out unit 3 can be moved closer to the table 13 from the downstream side thereof by retracting the positioning pins 32 and 33 to allow the fork 8 of the feed-out unit to feed out the substrate P without interference with the positioning pins 32 and 33.

It should be apparent to those skilled in the art that the present invention may be embodied in many other specific forms without departing from the spirit or scope of the invention. For example, the present invention may be embodied as follows:

a) Adjustment of the positions of the CCD cameras 123L, 123R, 175L and 175R in the X direction, which is designed to be carried out manually in the foregoing embodiment, may be carried out using a driving source such as a motor.

b) The motors employed as driving sources for moving the first and second printing position detecting units 121 and 122 in the Y direction may be replaced with air cylinders or hydraulic cylinders.

c) The ascending/descending drive motors 57 employed as driving sources for raising and lowering the stanchion 53 may be replaced with hydraulic cylinders.

d) The screen 62, which is retracted upward from the table 13 before the film thickness detector 91 is moved to carry out detection in the foregoing embodiment, may instead be displaced from the table 13.

e) While the film thickness detector 91 and the first printing position detecting unit 121 are designed to be supported by the carrying means including of the rotary shaft 96 and the ball screws 93. In the foregoing embodiment, these detectors 91 and 121 may be supported by a first carrying means and a second carrying means, which move independently.

f) Selection of the light path in each CCD camera, which is achieved by turning the prism in the foregoing embodiment, may be carried out by switching a reflecting mirror provided on the light path.

The reflecting mirror or the prism employed in the foregoing embodiment is a light path selector; the CCD sensor 180, an alignment mark detector; the actuator 179, a switch-driving means for driving the light path selector; and the CPU 71, a light path selection controller for controlling the light path selector.

g) While four CCD cameras are employed in the foregoing embodiment, the number of the CCD cameras is not be limited to four and may be one, two, three, five or more.

h) While a common CCD camera is adapted to constitute the first and second alignment mark detectors in the foregoing embodiment, alignment mark detectors such as CCD cameras may be provided for the screen and for the material to be printed on (printing material) to detect corresponding alignment marks, respectively.

i) While the table unit 12 constitutes the relative position adjusting means in the foregoing embodiment, the screen 62 itself or the mechanism for supporting the screen 62 may permit adjustment in the X, Y and theta (θ) directions, or both the table unit 12 and the screen 62 itself or the mechanism for supporting the screen 62 may permit adjustment in the X, Y and theta (θ) directions, respectively.

j) Each time a substrate P as a printing material is mounted on the table, the CCD cameras detect alignment marks to achieve alignment of the printing position in the above embodiment. However, the detection of alignment marks by the alignment mark detecting means such as CCD cameras may be carried out only one for certain printing runs. Thus, when the quantity of slackening of the screen is small, printing throughput time from feeding in to feeding out of the printing material can be reduced.

Therefore, the present examples and embodiments are to be considered as illustrative and not restrictive, and the invention is not to be limited to the details given herein, but may be modified within the scope of the appended claims.

What is claimed is:

1. An apparatus for printing on a substrate, comprising:
first supporting means for supporting the substrate;
film applying means for applying a film forming on the substrate;
second supporting means for supporting the film applying means for reciprocation between a vicinal position, where the film applying leans is close to the substrate, and a distant position, where the film applying means is spaced from the substrate;
film measuring means for measuring thickness of the film forming substance, said film measuring means being selectively positioned in a space between the substrate and said film applying means when said film applying means is in the distant position.

2. An apparatus according to claim 1 wherein said first supporting means comprises a table.

3. An apparatus according to claim 1 wherein said film applying means comprises a screen.

4. An apparatus according to claim 3 further comprising:
means for carrying the film measuring means into the space between the screen and the substrate when the screen is located at the distant position.

5. An apparatus according to claim 1 wherein the film measuring means comprises a laser irradiating section, wherein the laser irradiating section emits a laser beam toward the film and the substrate, producing a reflected light output.

6. An apparatus according to claim 5 wherein the film measuring means further receives the reflected light output and determines the film thickness therefrom.

7. An apparatus for printing a film forming substance on a material mounted on a table using a screen and a squeegee, wherein alignment marks are provided on the material and the screen, the apparatus comprising:

means for supporting the screen for reciprocation between a vicinal position, where the screen is close to the material, and a distant position, where the screen is spaced from the material;

means for detecting the alignment marks;

means for carrying the detecting means into a space between the screen and the material when the screen is located at the distant position;

means for adjusting the position of the table and that of the screen relative to each other;

means for applying the film forming substance on the material using the screen;

means for measuring a thickness of the film forming substance; and means for carrying the film measuring means into the space between the screen and the material when the screen is located at the distant position.

8. An apparatus according to claim 7 wherein the film measuring means comprises a laser irradiating section, wherein the laser irradiating section emits a laser beam toward the film and the material, producing a reflected light output.

9. An apparatus according to claim 8 wherein the film measuring means further receives the reflected light output and determines the film thickness therefrom.

10. A method for printing a film forming substance on a substrate, the method comprising the steps of:

positioning the substrate on a table applying the film forming substance on the substrate using a film forming substance applying apparatus;

separating the film forming substance applying apparatus from the substrate forming a space therebetween;

moving a probe into the space between the film forming substance applying apparatus and the substrate; and measuring a thickness of the film forming substance using the probe when the probe is positioned between the film forming substance applying apparatus and the substrate.

11. A method for providing a film forming substance on a substrate comprising the steps of:

positioning a screen near the substrate;

applying the film forming substance on the substrate using the screen;

separating the screen and the substrate so that a predetermined space exists therebetween;

moving a probe into the space; and measuring a thickness of the film forming substance using the probe.

12. A method of printing a film forming substance on a material mounted on a table, wherein alignment marks are provided on the material and the screen, the method comprising the steps of:

(a) locating the material on the table;

(b) providing the screen over the material;

(c) detecting the alignment marks provided on the material in a space between the screen and the material;

(d) detecting the alignment marks provided on the screen in the space between the screen and the material;

(e) adjusting the position of at least one of the table or the screen based on the detecting results to align the material and the screen;

(f) applying the film forming substance on the material using the screen;

(g) moving a probe into the space between the screen and the material; and (h) measuring a thickness of the film forming substance using the probe.

13. An apparatus according to claim 12 wherein the probe includes a laser for emitting a laser beam toward the film forming substance and the material, producing a reflected light output.

14. An apparatus according to claim 13 wherein the probe receives the reflected light output and provides a signal from which the thickness of the film can be determined.

* * * * *

UNITED STATES PATENT AND TRADEMARK OFFICE
CERTIFICATE OF CORRECTION

PATENT NO. : 5,906,158
DATED : May 25, 1999
INVENTOR(S) : Takai

It is certified that error appears in the above-identified patent and that said Letters Patent is hereby corrected as shown below:

Column 24, line 48, after "film forming", add --substance--.

Column 24, line 52, delete "leans", and add --means--.

Signed and Sealed this

Twelfth Day of October, 1999

Q. TODD DICKINSON

*Attest:*

*Attesting Officer*   *Acting Commissioner of Patents and Trademarks*